United States Patent
Kim et al.

(10) Patent No.: US 11,610,624 B2
(45) Date of Patent: Mar. 21, 2023

(54) MEMORY DEVICE SKIPPING REFRESH OPERATION AND OPERATION METHOD THEREOF

(71) Applicant: SAMSUNG ELECTRONICS CO., LTD., Suwon-si (KR)

(72) Inventors: Minsu Kim, Seongnam-si (KR); Namhyung Kim, Seoul (KR); Daejeong Kim, Seoul (KR); Dohan Kim, Hwaseong-si (KR); Chanik Park, Seongnam-si (KR); Deokho Seo, Suwon-si (KR); Wonjae Shin, Seoul (KR); Changmin Lee, Hwaseong-si (KR); Ilguy Jung, Hwaseong-si (KR); Insu Choi, Hwaseong-si (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/474,666

(22) Filed: Sep. 14, 2021

(65) Prior Publication Data
US 2022/0246200 A1 Aug. 4, 2022

(30) Foreign Application Priority Data

Feb. 4, 2021 (KR) ........................ 10-2021-0016281

(51) Int. Cl.
 *G11C 11/406* (2006.01)
(52) U.S. Cl.
 CPC .............. *G11C 11/40615* (2013.01)
(58) Field of Classification Search
 CPC ...... G11C 11/40615; G11C 2211/4067; G11C 11/40622; G11C 11/4063; G11C 11/4076; G11C 11/408

USPC ......................................................... 365/222
See application file for complete search history.

(56) References Cited

U.S. PATENT DOCUMENTS

| | | | |
|---|---|---|---|
| 7,821,861 B2 | 10/2010 | Lin et al. | |
| 10,529,406 B2 | 1/2020 | Choi et al. | |
| 10,777,252 B2 | 9/2020 | Fu et al. | |
| 10,790,005 B1 | 9/2020 | He et al. | |
| 10,803,919 B2 | 10/2020 | Kim et al. | |
| 11,195,568 B1* | 12/2021 | Atishay ................. | G11C 29/42 |

(Continued)

OTHER PUBLICATIONS

Bhati, I., et al., "DRAM Refresh Mechanisms, Penalties, and Trade-Offs", IEEE Transactions on Computers, vol. 65, No. 1, Jan. 2016, pp. 108-121.

*Primary Examiner* — Huan Hoang
(74) *Attorney, Agent, or Firm* — Sughrue Mion, PLLC

(57) ABSTRACT

Provided are a memory device skipping a refresh operation and an operating method thereof. The memory device includes a memory cell array including N rows; a refresh controller configured to control a refresh operation for the N rows of the memory cell array based on a refresh command; and an access information storage circuit including a plurality of registers configured to store flag information corresponding to each of the N rows, wherein a first value indicates rows that have been accessed, and a second value indicates rows that have not been accessed. The refresh controller is further configured to control whether the refresh operation is performed for a first row of the N rows at a refresh timing for the first row based on the flag information corresponding to the first row.

20 Claims, 18 Drawing Sheets

(56) References Cited

U.S. PATENT DOCUMENTS

| | | | |
|---|---|---|---|
| 2009/0161467 A1* | 6/2009 | Lin | G11C 11/40603 |
| | | | 365/222 |
| 2018/0166117 A1 | 6/2018 | Choi et al. | |
| 2020/0321049 A1 | 10/2020 | Meier et al. | |

* cited by examiner

| REFRESH MODE | NUMBER OF SKIPS FOR EACH ROW |
|---|---|
| x1 | OPTIONAL |
| x2 | MAX. 1 |
| x4 | MAX. 3 |

| BIT VALUES | | AND GATE INPUT VALUE | | FLAG VALUE | OPERATION |
|---|---|---|---|---|---|
| 2ND | 1ST | 2ND | 1ST | | |
| 0 | 0 | 1 | 0 | 0 | INITIAL |
| 0 | 1 | 1 | 1 | 1 | ROW K ACCESS |
| 1 | 0 | 0 | 0 | 0 | RESET AFTER PERFORMING POLICY |
| 1 | 1 | 0 | 1 | 0 | ROW K ACCESS |
| 0 | 0 | 1 | 0 | 0 | RESET AFTER PERFORMING REFRESH |
| 0 | 1 | 1 | 1 | 1 | ROW K ACCESS |

MEMORY DEVICE SKIPPING REFRESH OPERATION AND OPERATION METHOD THEREOF

CROSS-REFERENCE TO RELATED APPLICATION

This application claims priority from Korean Patent Application No. 10-2021-0016281, filed on Feb. 4, 2021, in the Korean Intellectual Property Office, the disclosure of which is incorporated by reference herein in its entirety.

BACKGROUND

Methods, apparatuses and systems consistent with example embodiments relate to a memory device, and more particularly, to a memory device skipping a refresh operation and an operating method thereof.

The degree of integration and speed of memory devices widely used in high-performance electronic systems are increasing. Volatile memory devices such as dynamic random access memory (DRAM) require periodic refreshing of memory cells, and as the degree of integration of DRAM is increased, the number of refreshing operations may be increased.

A memory device may access a row in a bank (e.g., a memory bank) including a plurality of rows to perform a memory operation such as data writing and reading, and memory cells of the accessed row may have the effect in which a refresh operation is performed. Accordingly, when the refresh operation is controlled by considering the characteristics of the memory device as described above, power consumption may be reduced, and the use efficiency of the memory device may be increased.

SUMMARY

One or more example embodiments provide a memory device and an operating method thereof, thereby reducing power required for a refresh operation and improving the efficiency of using the memory device.

According to an aspect of an example embodiment, a memory devices includes: a memory cell array including N rows, wherein N is an integer greater than or equal to 2; a refresh controller configured to control a refresh operation for the N rows of the memory cell array based on a refresh command; and an access information storage circuit including a plurality of registers configured to store flag information corresponding to each of the N rows, wherein a first value indicates rows that have been accessed, and a second value indicates rows that have not been accessed. The refresh controller is further configured to, at a refresh timing for a first row of the N rows: based on the flag information corresponding to the first row having the first value, control the refresh operation for the first row to be skipped, and based on the flag information corresponding to the first row having the second value, control the refresh operation for the first row to be performed.

According to an aspect of an example embodiment, an operating method of a memory device includes: accessing a first row from among N rows provided in a memory cell array, wherein N is an integer greater than or equal to 2; storing flag information having a first value in a first register corresponding to the first row in an access information storage circuit including a plurality of registers; identifying the flag information stored in the first register corresponding to the first row at a refresh timing for the first row based on a refresh command; and skipping a refresh operation for the first row based on the flag information corresponding to the first row having the first value.

According to an aspect of an example embodiment, an operating method of a memory device with a memory cell array having N rows (N being an integer greater than or equal to 2) includes: accessing a first row based on a first access request received from a first host device in a first refresh period; refreshing the first row at a refresh timing for the first row based on a first refresh command received from the first host device; accessing the first row based on a second access request from a second host device in a second refresh period; storing flag information of a first value in a first register corresponding to the first row in an access information storage circuit including a plurality of registers; and skipping a refresh operation for the first row at the refresh timing for the first row based on a second refresh command received from the second host device.

BRIEF DESCRIPTION OF THE DRAWINGS

The above and other aspects, features, and advantages will be more clearly understood from the following description taken in conjunction with the accompanying drawings in which.

DETAILED DESCRIPTION

Example embodiments will now be described in detail with reference to the accompanying drawings.

Figure 1:
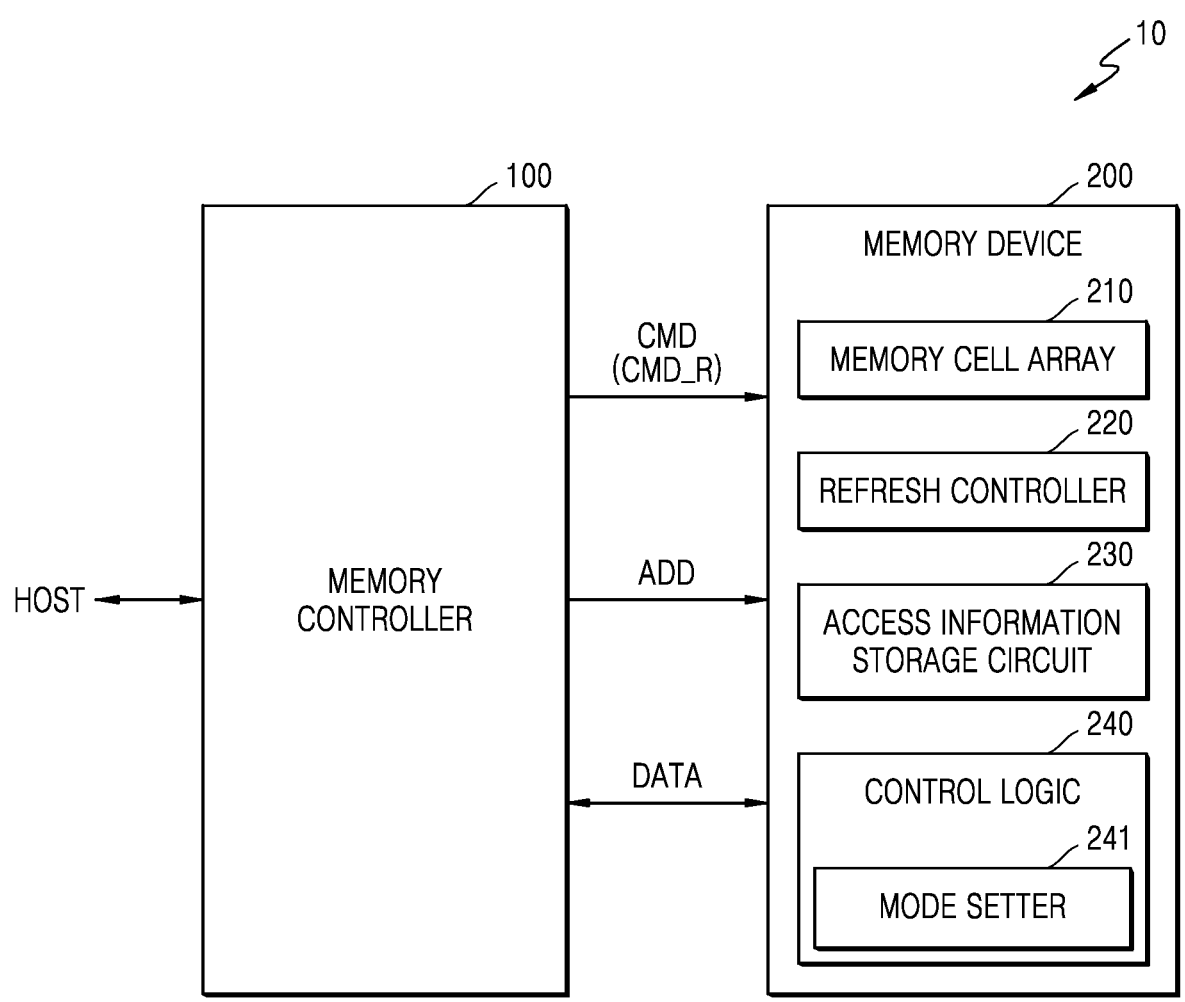
FIG. 1 is a block diagram illustrating a memory system according to an example embodiment.

FIG. 1 is a block diagram illustrating a memory system 10 according to an example embodiment.

Referring to FIG. 1, the memory system 10 may include a memory controller 100 and a memory device 200. The memory device 200 may include a memory cell array 210, a refresh controller 220, an access information storage circuit 230, and a control logic 240. In addition, according to an example embodiment, the control logic 240 may include a mode setter 241, which may set an operation mode related to the performing and skipping of a refresh operation. The control logic 240 may manage and control a refresh operation according to a mode set by the mode setter 241. Also, the control logic 240 may control all operations of the memory device 200, and may further include a command/address decoder which may perform a decoding operation for a command CMD and an address ADD from the memory controller 100.

The memory controller 100 may control memory operations such as write/read and refresh operations by providing various types of signals to the memory device 200 through a memory interface. For example, the memory controller 100 may access data DATA of the memory cell array 210 by providing the command CMD and the address ADD to the memory device 200. In addition, when the memory device 200 includes a dynamic random access memory (DRAM) chip including DRAM memory cells, the command CMD may include a refresh command CMD_R for various unique operations related to DRAM, for example, an operation of refreshing memory cells.

The memory controller 100 may access the memory device 200 according to a request from a host HOST. The memory device 200 may communicate with the host HOST through the memory controller 100 based on various specifications, and for example, various specifications, such as double data rate (DDR) synchronous dynamic random-access memory (SDRAM), DDR2 SDRAM, DDR3 SDRAM, DDR4 SDRAM, DDR5 SDRAM, low-power double data rate (LPDDR) SDRAM, LPDDR2 SDRAM, LPDDR3 SDRAM, LPDDR4 SDRAM, LPDDR4X SDRAM, LPDDR5 SDRAM, graphics double data rate (GDDR) synchronous graphics random access memory (SGRAM), GDDR2 SGRAM, GDDR3 SGRAM, GDDR4 SGRAM, GDDR5 SGRAM, GDDR6 SGRAM, or the like, may be applied to example embodiments.

The memory cell array 210 may include a plurality of word lines, and a plurality of memory cells may be connected to each of the plurality of word lines. For example, the plurality of memory cells connected to one word line may be referred to as a row, and the memory cell array 210 may include a plurality of rows.

The refresh controller 220 may control a refresh operation for the plurality of rows. For example, the refresh controller 220 may include a circuit (e.g., an address counter) to generate a refresh address for sequentially instructing the plurality of rows, and each time the refresh command CMD_R is received from the memory controller 100, the refresh controller 220 may generate a refresh address through a counting operation of the address counter. According to an example embodiment, in response to the reception of the refresh command CMD_R, the refresh controller 220 may perform various control operations to perform a refresh operation for a target row (e.g., a row selected at a corresponding refresh timing), skip the refresh operation of the target row, or refresh rows other than the target row.

The access information storage circuit 230 may store information indicating an accessed row among the plurality of rows. For example, the access information storage circuit 230 may include a plurality of registers respectively corresponding to the plurality of rows, and flag information corresponding to each of the plurality of rows may be stored in each of the plurality of registers. For example, the memory controller 100 may transmit the command CMD and the address ADD to access the data DATA, and determine which row is accessed by checking the address ADD. Flag information corresponding to the accessed row may be updated or changed to a certain value (e.g., logic "1"). Alternatively, in an example embodiment, the memory device 200 may also be implemented such that the flag information corresponding to the accessed row is changed from logic "1" to logic "0".

The control logic 240 may perform a mode setting operation related to a refresh policy for an accessed row. For example, setting information related to mode setting may be provided to the memory device 200 from the memory controller 100, and the mode setter 241 may perform a setting operation related to the skipping and performing of a refresh operation based on the setting information.

In an example of operation, as the refresh command CMD_R is received, the refresh controller 220 may generate a refresh address indicating a target row. In addition, in the access information storage circuit 230, flag information stored in a register corresponding to the target row may be provided to the refresh controller 220, and the refresh controller 220 may perform or skip a refresh operation for the target row based on a value of the flag information. When the flag information has a value (e.g., logic "1") indicating that the target row has been accessed previously, the refresh controller 220 may skip a refresh operation for the target row. On the contrary, when the flag information has a value of logic "0", the refresh controller 220 may perform a refresh operation for the target row.

According to an example embodiment, a refresh operation based on flag information may be variously controlled according to mode setting. For example, according to mode setting, even when the flag information has a value of logic "1", the refresh controller 220 may perform a refresh operation for the target row. Alternatively, according to mode setting, when the flag information has a value of logic "1", the refresh controller 220 may refresh other rows at a corresponding refresh timing instead of skipping a refresh operation for the target row. For example, a refresh operation may be performed for a row corresponding to a flag value "0" among rows to be refreshed after the target row, address information of weak rows having relatively poor characteristics among the plurality of rows may be stored in a storage circuit in the memory device 200, or a refresh operation may be performed for a weak row at the refreshing timing.

According to an example embodiment, because the memory device 200 may skip a refresh operation for rows that have been previously accessed and effectively refreshed through the refresh operation, refresh operations performed in one refresh period may be reduced, and accordingly, power consumption required for refresh may be reduced. In addition, because an interval (or a time interval at which a refresh command is provided) of refresh timings in one refresh period may be increased, a longer time for a memory operation may be ensured, and the use efficiency of the memory device 200 may be increased.

According to the above example embodiment, an operation of setting flag information in registers and management of a refresh operation according to a refresh policy may be performed by various components in the memory device 200. For example, the control logic 240 and/or the refresh controller 220 may include a component to set registers of the access information storage circuit 230 based on the address ADD from the memory controller 100. In addition, the refresh policy described above may include various cases such as skipping/performing of a refresh operation, a refresh operation of other rows, or the like, and the refresh controller 220 may perform a refresh operation according to a preset refresh policy based on control from the control logic 240.

The memory device 200 may be dynamic random access memory, such as DDR SDRAM, LPDDR SDRAM, GDDR SDRAM, Rambus dynamic random access memory (RDRAM), or the like. However, example embodiments are not limited thereto, and for example, the memory device 200 may be non-volatile memory such as magnetic random access memory (MRAM), ferroelectric RAN (FeRAM), phase change RAM (PRAM), resistive RAM (ReRAM), or the like, and example embodiments may be applied to a memory device that performs a data retention operation corresponding to a refresh.

In an example embodiment, the memory device 200 may be a semiconductor package including one or more memory chips. Alternatively, the memory device 200 may be a memory module in which one or more memory chips are mounted on a module board, or the memory device 200 of FIG. 1 may be any one memory chip of a memory module.

Although the memory controller 100 and the host HOST are illustrated as having separate configurations in FIG. 1, example embodiments are not limited thereto. For example, the host HOST may be a device including an application processor or a central processing unit (CPU) as a component, and the memory controller 100 may be included in the host HOST.

In an example embodiment, even when a target row corresponds to an accessed row, the target row may be refreshed according to a refresh policy controlled by the mode setter 241. In this case, an operation of updating flag information in a register corresponding to a row to be accessed and an operation of determining flag information of a register when performing a refreshing operation on the target row may not be performed, and a plurality of rows may be sequentially refreshed regardless of the flag information.

Figure 2:
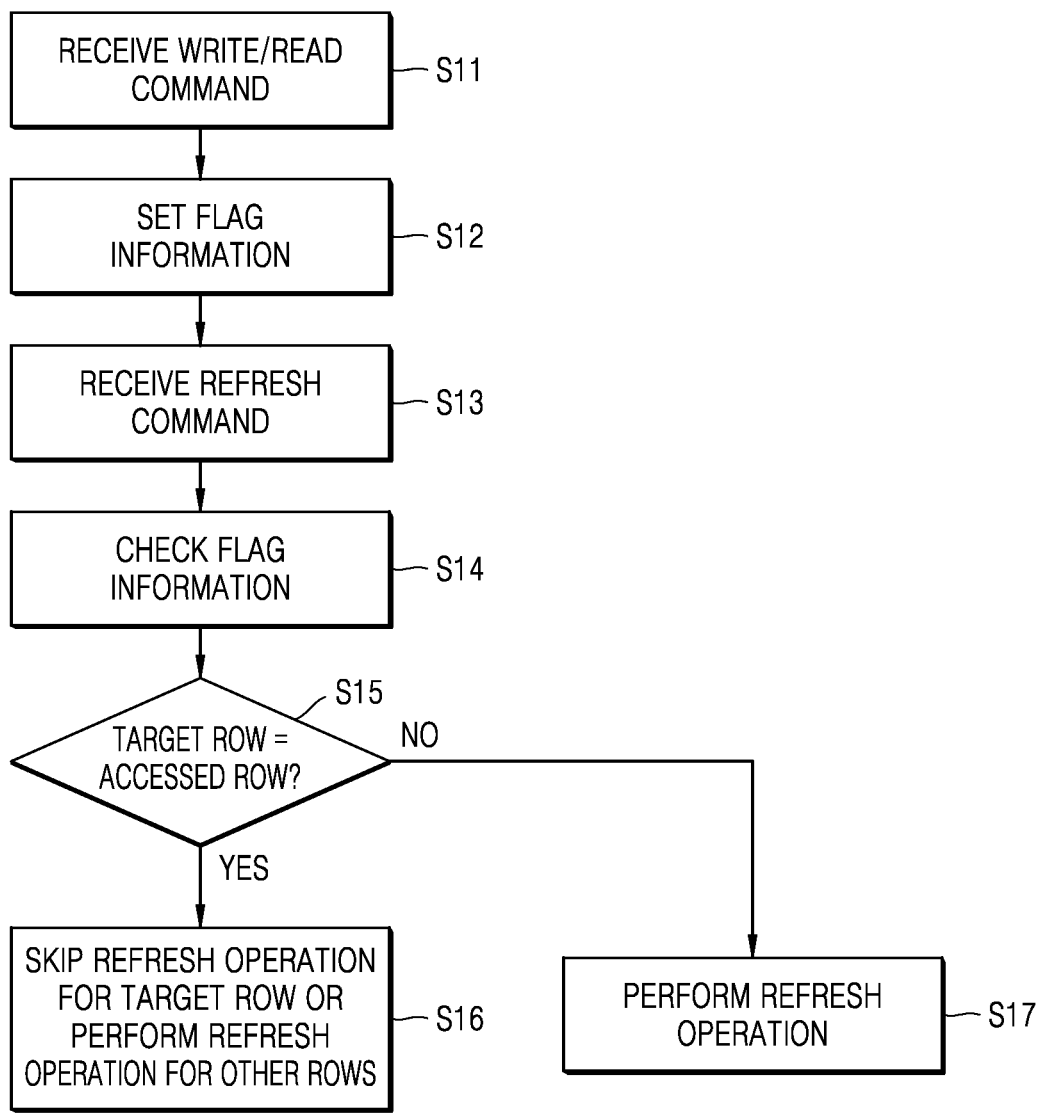
FIG. 2 is a flowchart of an operating method of a memory device according to an example embodiment.

FIG. 2 is a flowchart of an operating method of a memory device according to an example embodiment.

The memory device may include registers that store flag information for checking whether refresh operations for a plurality of rows are to be skipped, and a value of the flag information may be changed according to whether the plurality of rows are accessed.

Referring to FIG. 2, the memory device may receive a command for a normal memory operation, such as a write/read command, from a memory controller (or a host) in operation S11. Although the write/read command is described as an example in FIG. 2, various commands accompanying an active operation for the plurality of rows may be received from the memory controller. In addition, in operation S12, an address corresponding to the command may be received from the memory controller, and flag information may be set to a certain value (e.g., logic "1") in a register corresponding to a row indicated by the received address to indicate the row has been accessed.

Thereafter, the memory device may receive a refresh command from the memory controller in operation S13, and flag information corresponding to a target row to be refreshed may be checked from the register in operation S14. It is determined whether the target row corresponds to an accessed row according to a value of the flag information in operation S15, and when the target row corresponds to the accessed row, a refresh operation for the target row may be skipped or rows other than the target row may be refreshed in operation S16. On the contrary, when the target row does not correspond to the accessed row, the refresh operation for the target row may be performed in operation S17.

Figure 3:
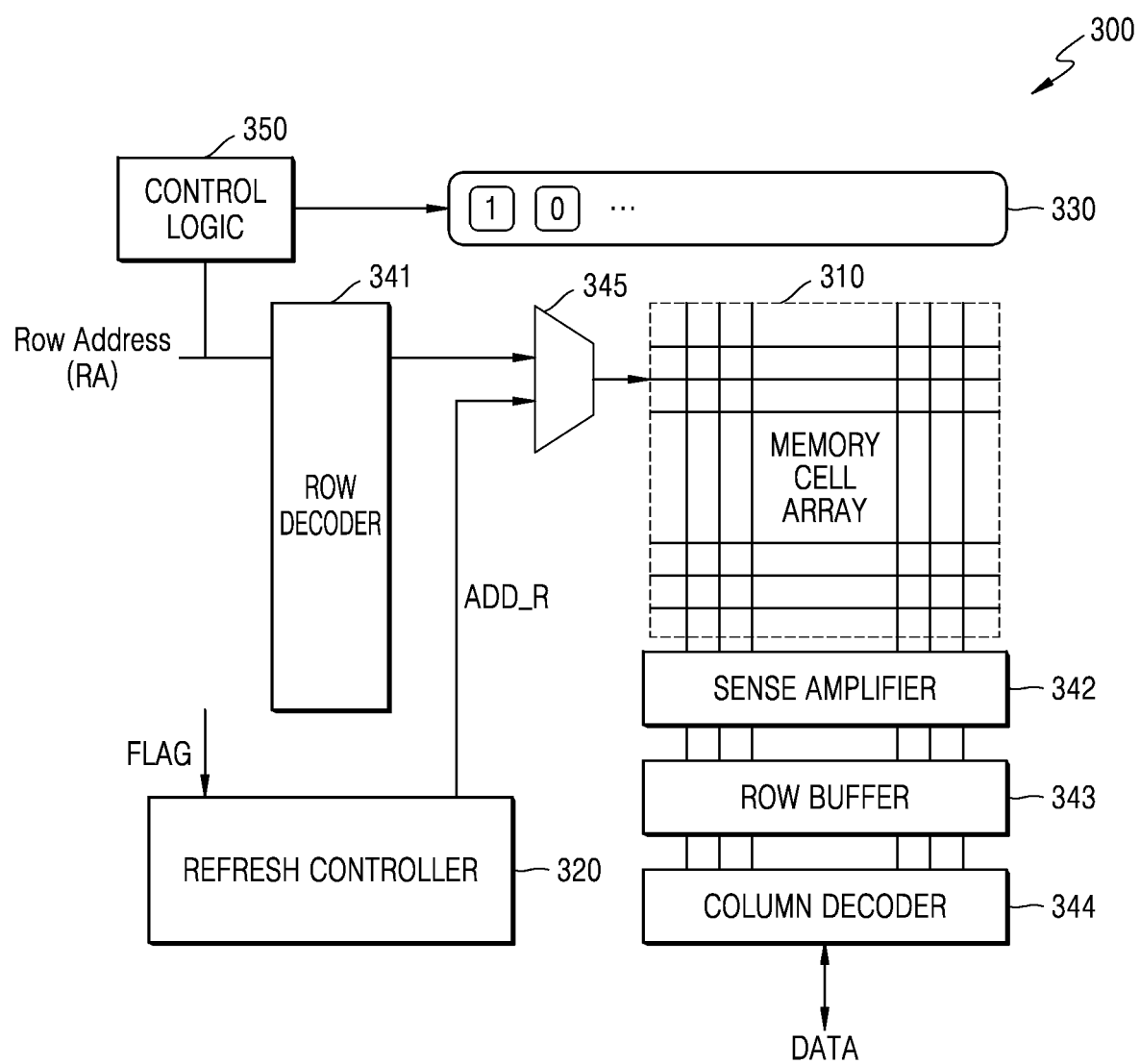
FIG. 3 is a block diagram illustrating an implementation example of a memory device according to an example embodiment.

FIG. 3 is a block diagram illustrating an implementation example of a memory device 300 according to an example embodiment.

Referring to FIG. 3, the memory device 300 may include a memory cell array 310, a refresh controller 320, and an access information storage circuit 330. For example, the access information storage circuit 330 may include a register. In addition, the memory device 300 may include various peripheral circuits for driving memory cells of the memory cell array 310. For example, the memory device 300 may further include a row decoder 341, a sense amplifier 342, a row buffer 343, a column decoder 344, a selector 345, and a control logic 350. In the example embodiment shown in FIG. 3, detailed descriptions of general components in the memory device 300 are omitted.

An address for data access may be received from a host, and the address may include a row address RA indicating a row of the memory cell array 310. The control logic 350 may determine a position of a register in which a value of flag information Flag needs to be changed based on the row address RA, and the value of the flag information Flag of the position in the register in the access information storage circuit 330 may be set to "1" based on the control of the control logic 350. On the contrary, values of the flag information Flag of registers corresponding to other rows which have not been accessed may be maintained as "0".

When any one row of the memory cell array 310 is activated in a data access operation (e.g., a data output operation), data of the activated row may be amplified through the sense amplifier 342, and accordingly, the activation of the row may have an effect similar to a refresh operation. The amplified data of the row may be temporarily stored in the row buffer 343, and the data temporarily stored in the row buffer 343 may be provided to a memory controller (or a host) through the column decoder 344.

As a refresh command is received from the memory controller, the refresh controller 320 may output a refresh address ADD_R indicating a row (target row) to be refreshed. At this time, the refresh controller 320 may check flag information Flag stored in a register corresponding to the target row, and for example, the flag information Flag stored in the access information storage circuit 330 may be provided to the refresh controller 320 based on the control of the control logic 350. According to a value of the flag information Flag, the refresh controller 320 may skip a refresh operation for the target row by not outputting the refresh address ADD_R. For example, if the flag information Flag indicates the target row has been accessed, then the refresh controller 320 may control the refresh address ADD_R to not be output, and to thereby skip the refresh operation for the target row. Alternatively, the refresh controller 320 may also perform a control operation such that rows other than the target row that have not been accessed may be refreshed. For example, the refresh controller 320 may check flag information Flag corresponding to one or more rows following the target row and output the refresh address ADD_R indicating a row in which corresponding flag information Flag has a value of "0".

The selector 345 may receive the row address RA for performing a normal operation and a refresh address ADD_R for performing a refresh operation, and for example, according to a type of a received command, the selector 345 may selectively output any one of the row address RA and the refresh address ADD_R based on the control of the control logic 350. Although it has been described that the setting of the flag information Flag and a refresh control according to a value of the flag information Flag are performed by the control logic 350, a component required for the above setting and refresh control may also be included in the refresh controller 320.

Figure 4:
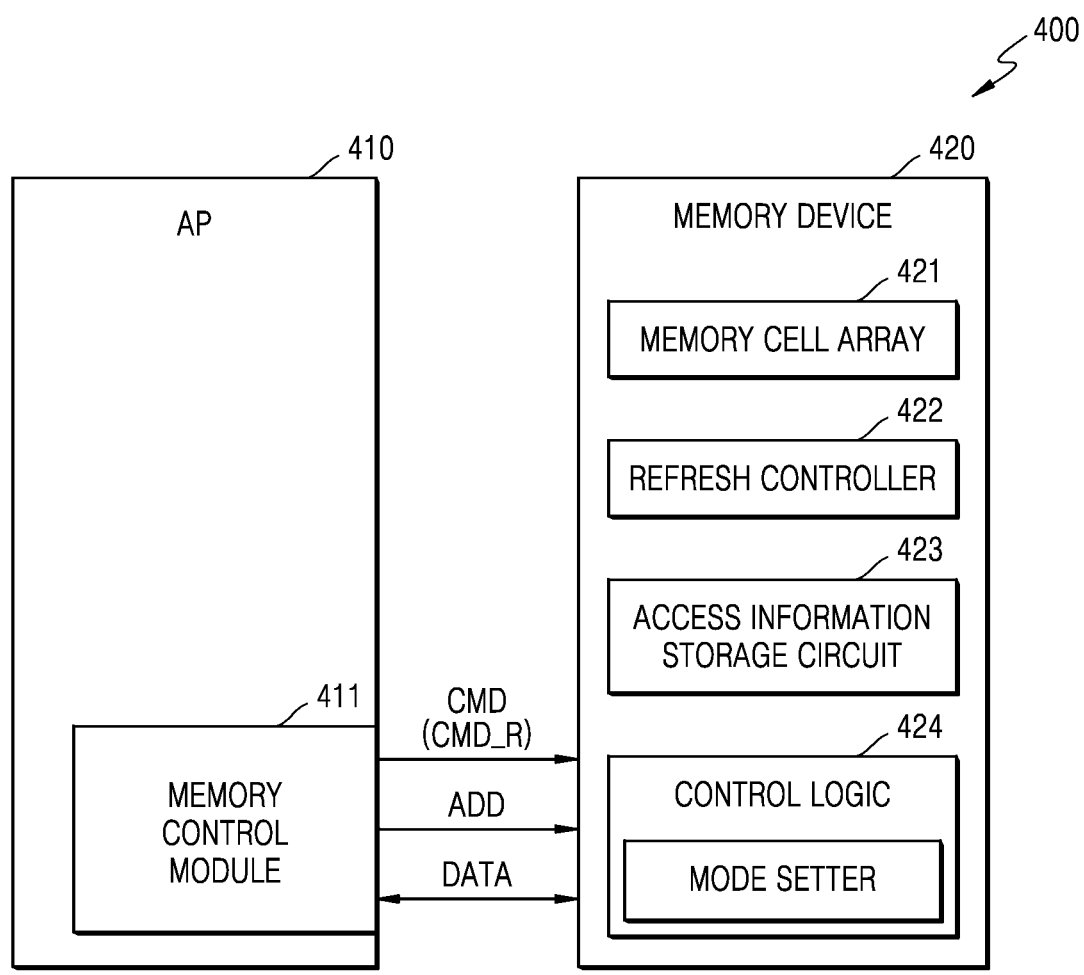
FIG. 4 is a block diagram illustrating a memory system according to another example embodiment.

FIG. 4 is a block diagram illustrating a memory system 400 according to another example embodiment. An application processor (AP) 410 and a memory device 420 are illustrated in FIG. 4, and the memory system 400 may include the AP 410 and the memory device 420. For example, the AP 410 may include a memory controller module 411. The memory device 420 may include a memory cell array 421, a refresh controller 422, an access information storage circuit 423, and a control logic 424, and the control logic 424 may include a mode setter. For example, the access information storage circuit 423 may include a register.

The AP 410 may be implemented as a system on chip (SoC). The SoC may include a system bus to which a protocol having a certain standard bus specification is applied, and may include various Intellectual Properties (IPs) related to the system bus. As a standard specification of the system bus, an advanced microcontroller bus architecture (AMBA) protocol of the advanced RISC machine (ARM), Ltd. may be applied. A bus type of the AMBA protocol may include advanced high-performance bus (AHB), advanced peripheral bus (APB), advanced extensible interface (AXI), AXI4, AXI coherency extensions (ACE), or the like. In addition, other types of protocols may also be applied, such as uNetwork of SONICs Inc., CoreConnect of IBM Corporation, and open core protocol of OCP-IP.

The memory device 420 may perform the refresh operation in the above-described example embodiment. For example, the refresh controller 422 may control a refresh operation for a target row in response to the reception of the refresh command CMD_R, check, from the access information storage circuit 423, a value of flag information of a register corresponding to the target row before performing the refresh operation, and perform or skip the refresh operation for the target row based on the result of checking the value of the flag information. For example, when the memory system 400 is applied to a mobile device or the like, according to an example embodiment, the number of refresh operations to be performed within one refresh period may be reduced, and accordingly, power consumption of the mobile device due to the refresh operation may be reduced.

Figure 5:
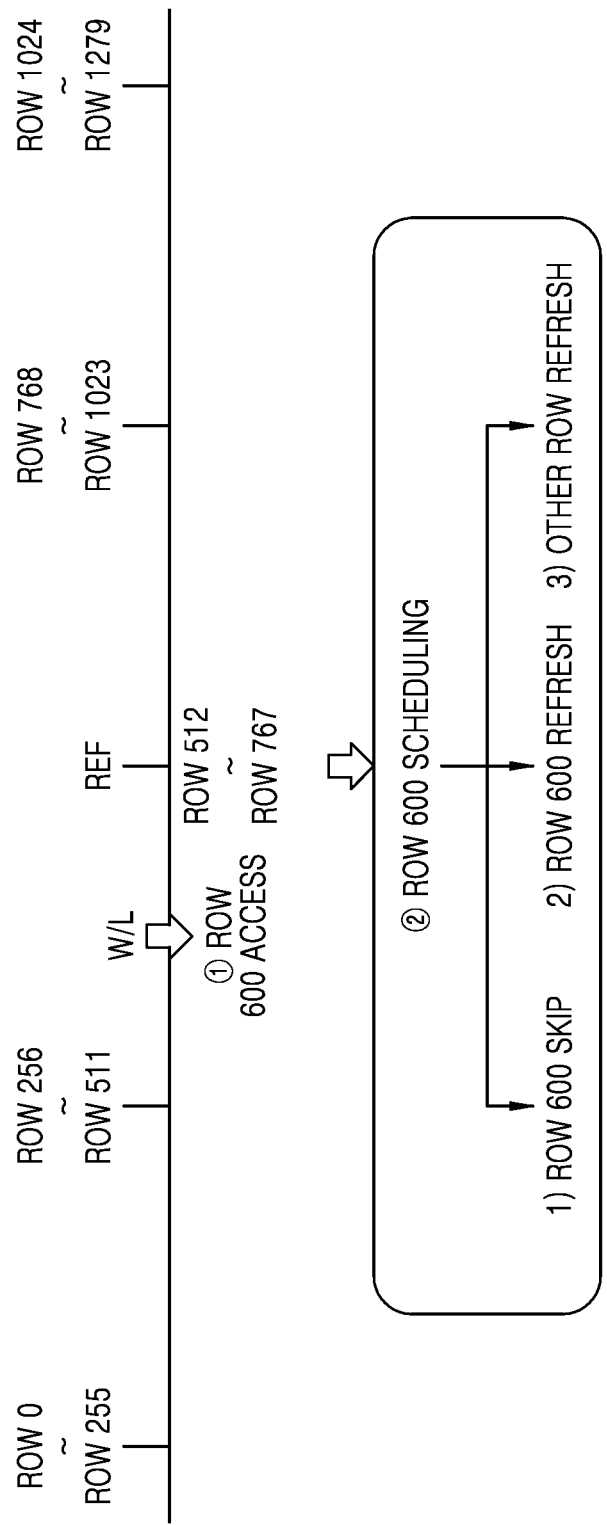
FIG. 5 is a diagram illustrating a refresh operation according to an example embodiment.

FIG. 5 is a diagram illustrating an example of a refresh operation according to an example embodiment. In FIG. 5, an example in which a first row, Row 0, to a 1280th row, Row 1279, is refreshed once in one refresh period is illustrated.

One or more rows may be refreshed in response to one refresh command from a memory controller, and the time required for a refresh operation in response to one refresh command may be defined by a parameter tRFC. In addition, during one refresh period, a plurality of refresh commands may be sequentially provided to a memory device from the memory controller, and a time interval at which the plurality of refresh commands are received may be defined by a parameter tREFI. In FIG. 5, a case where 256 rows are refreshed in response to one refresh command is illustrated, but example embodiments are not limited thereto, and one row may be refreshed in response to one refresh command, or a different number of rows may also be refreshed in response to one refresh command.

As shown in FIG. 5, a refresh operation for a first plurality of rows (e.g., Row 0 to Row 255) may be performed in response to one refresh command, and in addition, a refresh operation for a second plurality of rows (e.g., Row 256 to Row 511) may be performed in response to a next refresh command. According to the above-described example embodiments, when performing a refresh operation for each of the plurality of rows, flag information corresponding to each of the plurality of rows may be checked. In addition, some of the plurality of rows may be accessed before the next refresh command is received, and for example, access to a 601st row Row 600 among rows that have not been refreshed yet within the refresh period may be performed, and a value of the flag information corresponding to the 601st row Row 600 may be set to a first value to indicate the 601st row Row 600 has been accessed.

In refreshing other rows (e.g., Row 512 to Row 767) in response to the next refresh command, the value of the flag information corresponding to the 601st row Row 600 may be checked at a refresh timing for the 601st row Row 600, and a refresh operation may be managed differently according to the value of the flag information. For example, as the flag information has a value of "1", according to a mode set in the memory device, a refresh operation for the 601st row Row 600 may be skipped, or the refresh operation for the 601st row Row 600 may be performed even though the flag information indicates the 601st row Row 600 has been accessed. Alternatively, instead of the 601st row Row 600, other rows may be refreshed at a corresponding refresh timing, and for example, a row following the 601st row Row 600 may be refreshed, or a weak row existing in the memory device may be refreshed.

Figure 6:
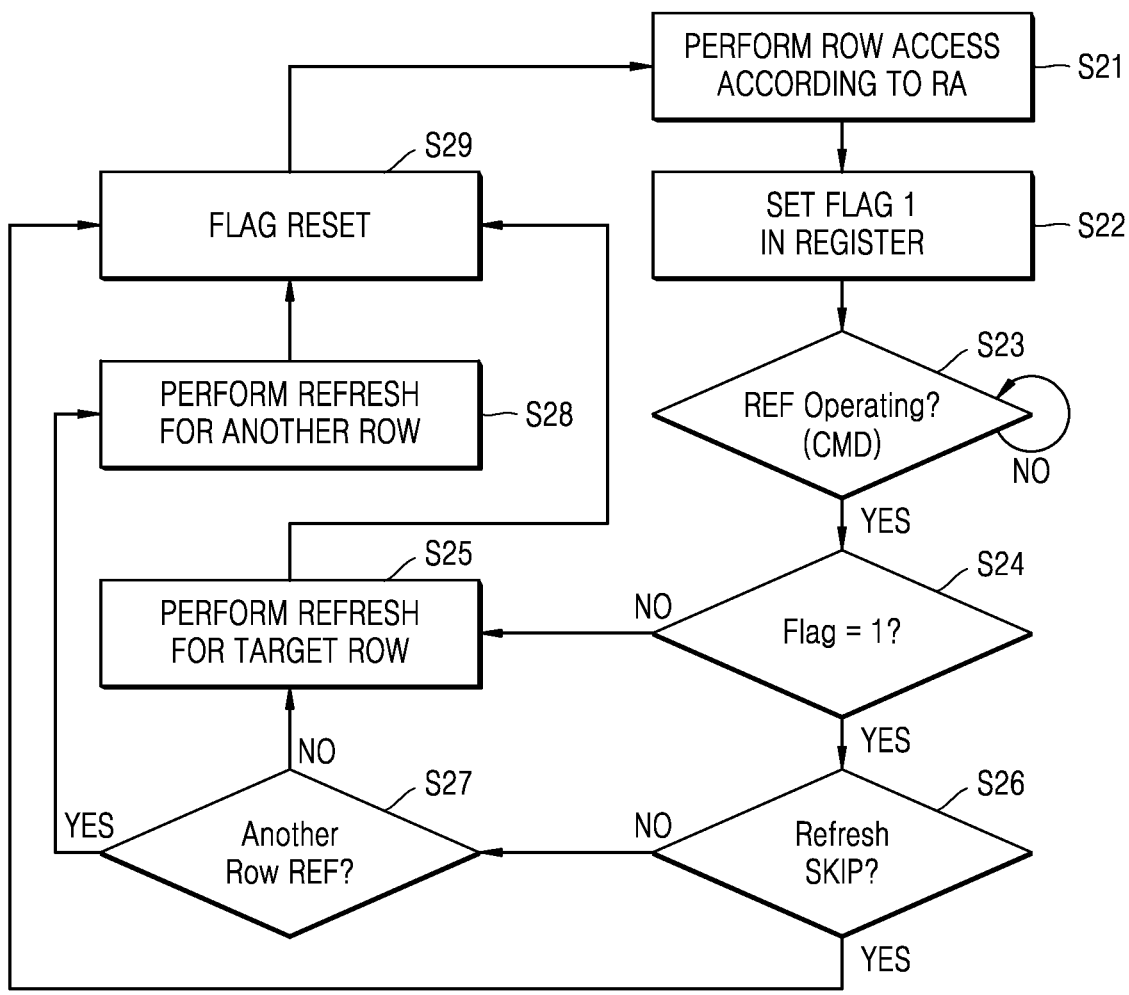
FIG. 6 is a time-series flowchart illustrating a refresh operation according to an example embodiment.

FIG. 6 is a time-series flowchart illustrating a refresh operation in the example embodiment shown in FIG. 5.

Referring to FIG. 6, a row access may occur according to a row address RA in operation S21, and accordingly, a value of flag information in a corresponding register may be set to "1" to indicate the row access in operation S22. Thereafter, as a refresh command is provided from the memory controller, a timing at which a refresh operation is performed may be determined in operation S23. When it is not determined to be a timing for performing a refresh operation, the refresh operation may not be performed, and a standby state or other normal memory operations may be performed in the memory device. When it is determined to correspond the timing for performing a refresh operation, a value of the flag information stored in a register may be determined.

For example, it is determined whether the value of the flag information is "1" in operation S24, and when the value of the flag information is not "1", a refreshing operation for a target row may be performed in operation S25. When the value of the flag information is "1", a refresh operation may be managed based on various policies according to mode setting in the memory device, and for example, it may be determined whether a refresh skip mode is set in operation S26. When the refresh skip mode is set, the refresh operation for the target row may be skipped, and the value of the flag information corresponding to the target row may be reset to a value of "0" in operation S29.

On the contrary, when the refresh skip mode is not set, at least one row may be refreshed at a refresh timing for the target row, and for example, it may be determined whether a mode is set to refresh other rows in operation S27. When it is not a mode refreshing other rows, the refresh operation for the target row may be performed at the refresh timing in operation S25. When it is a mode performing a refresh operation for other rows, at least one row other than the target row may be refreshed at the refresh timing in operation S28. According to the above-described example embodiment, at least one row in which corresponding flag information has a value of "0" among rows following the target row may be refreshed, or at least one weak row may be refreshed at the refresh timing by referring to weak row address information separately stored in the memory device. In addition, after the target row is refreshed or at least one other row is refreshed, the value of the flag information corresponding to the target row may be reset to a value of "0" in operation S29.

Figure 7:
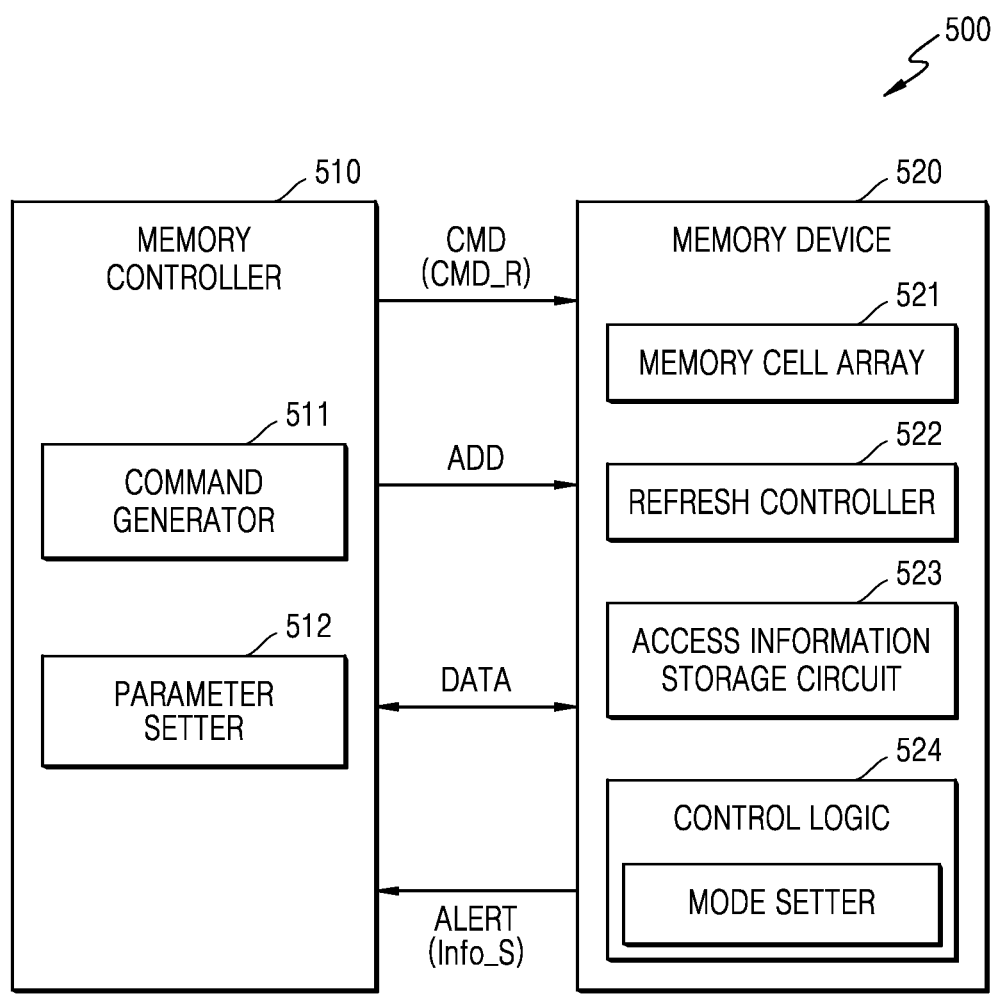
FIG. 7 is a block diagram illustrating a memory system according to example embodiments.

FIG. 7 is a block diagram illustrating a memory system 500 according to various example embodiments. In the following description, it is assumed that when flag information corresponds to "0", a refresh operation for a target row is performed, and when the flag information corresponds to "1", the refresh operation of the target row is skipped.

Referring to FIG. 7, the memory system 500 may include a memory controller 510 and a memory device 520, and the memory device 520 may include a memory cell array 521, a refresh controller 522, an access information storage circuit 523, and a control logic 524. For example, the access information storage circuit 523 may include a register. In addition, the memory controller 510 may include a command generator 511 and a parameter setter 512, and an example in which the parameter setter 512 sets a first parameter tREFI related to a refresh interval and a second parameter tRFC related to a time for performing a refresh operation in response to one refresh command is shown.

The memory device 520 may receive a command CMD and an address ADD from the memory controller 510, and may transmit and receive data DATA related to a data write/read operation to/from the memory controller 510. In addition, the memory device 520 may perform the refresh operation according to the above-described example embodiments in response to the refresh command CMD_R from the memory controller 510, and for example, may perform or skip the refresh operation for the target row according to the flag information stored in the access information storage circuit 523.

In an example embodiment, the memory controller 510 and the memory device 520 may transmit and receive various types of information by using at least one terminal (or pin), and for example, the memory device 520 may provide skip information Info_S to the memory controller 510 through a notification terminal Alert. Although information transmission through a separate notification terminal Alert is illustrated in FIG. 7, example embodiments are not limited thereto and the skip information Info_S may also be provided to the memory controller 510 by using other terminals (e.g., at least one terminal among data DATA terminals).

In an example embodiment, the skip information Info_S may have information related to a skip frequency of a refresh operation. For example, when a frequency of access to the memory device 520 is high, the number of rows for which access is performed among a plurality of rows to be refreshed may increase, and accordingly, the number of times the refresh operation for the target row is skipped may increase. A component of the memory device 520, for example, the refresh controller 522 or the control logic 524, may determine whether a refresh operation is skipped through checking the flag information, and may generate and provide the skip information Info_S capable of checking a frequency at which a refresh operation is skipped to the memory controller 510.

The parameter setter 512 may set the first parameter tREFI and the second parameter tRFC based on the skip information Info_S. When the frequency at which a refresh operation is skipped increases in the memory device 520, the number of rows that are actually refreshed within one refresh period may be reduced, and accordingly, the parameter setter 512 may increase a value of the first parameter tREFI. That is, the number of refresh commands CMD_R provided by the memory controller 510 to the memory device 520 within one refresh period may be reduced, and accordingly, the command generator 511 may increase a transmission period of the refresh command CMD_R based on the value of the first parameter tREFI.

The memory device 520 may refresh one or more rows during a time corresponding to the second parameter tRFC in response to one refresh command CMD_R. When the frequency at which a refresh operation is skipped increases in the memory device 520, the number of rows that are actually refreshed in response to one refresh command CMD_R may be reduced, and accordingly, a value of the second parameter tRFC may be reduced. Accordingly, it is assumed that the transmission period of the refresh command CMD_R is the same, and when the value of the second parameter tRFC is reduced, more time for data access may be ensured, and accordingly, the use efficiency of the memory device 520 may be increased.

In an example embodiment, the first parameter tREFI and the second parameter tRFC, which are set by the parameter setter 512, may be transmitted to the memory device 520 through at least one terminal, and may be set in the memory device 520. For example, the memory device 520 may receive the first parameter tREFI and the second parameter tRFC, and may set the same in an internal storage circuit (e.g., a mode register set).

Figure 8:
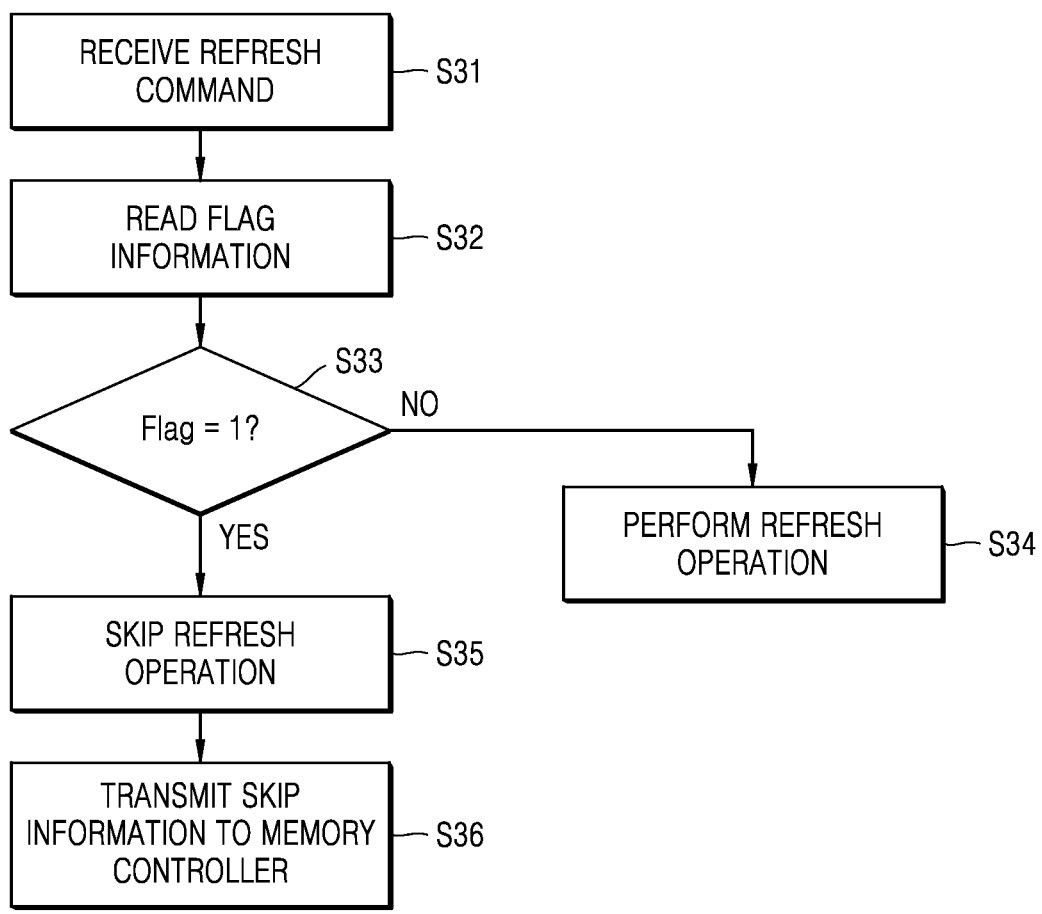
FIG. 8 is a flowchart illustrating an operating method of a memory device according to an example embodiment.

FIG. 8 is a flowchart illustrating an operating method of a memory device according to an example embodiment. An example in which a memory device transmits skip information to a memory controller is illustrated in FIG. 8.

Referring to FIG. 8, the memory device may receive a refresh command from the memory controller in operation S31. Flag information corresponding to a target row may be read according to the above-described example embodiments at a corresponding refresh timing in operation S32. It may be determined whether a value of the flag information corresponds to "1" in operation S33. As a result of determination, when the value of the flag information does not correspond to "1", a refresh operation for a target row may be performed in operation S34, and when the value of the flag information corresponds to "1", the refresh operation for the target row may be skipped in operation S35.

In addition, skip information may be transmitted to the memory controller according to the value of the flag information at the refresh timing in operation S36. When the refresh operation for the target row is skipped as the value of the flag information corresponds to "1", skip information indicating that the refresh operation for the target row is skipped may be transmitted to the memory controller. On the contrary, when the refresh operation for the target row is performed as the value of the flag information does not correspond to "1", skip information indicating that the refresh operation for the target row is performed may be transmitted to the memory controller. In an example embodiment, when the refresh operation for the target row is performed as the value of the flag information does not correspond to "1", the memory device may also be implemented so that skip information is not transmitted to the memory controller.

The memory controller may determine a frequency at which a refresh operation is skipped in the memory device based on the skip information received during one refresh period, and accordingly, may perform the parameter setting operation in the above-described example embodiments. For example, in one refresh period, when it is determined that the frequency at which a refresh operation is skipped is increased based on the skip information, the parameter setting operation may be performed such that the value of the first parameter tREFI described above is increased, or the value of the second parameter tRFC is reduced.

Figure 9A:
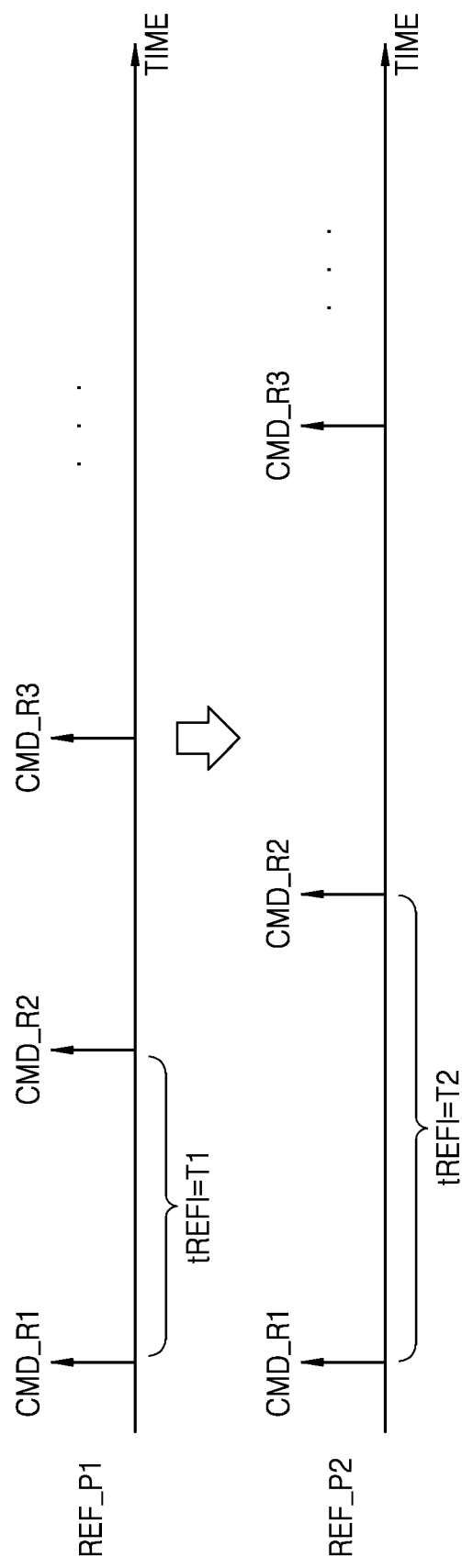
FIGS. 9A and 9B are diagrams illustrating a refresh operation according to example embodiments.
Figure 9B:
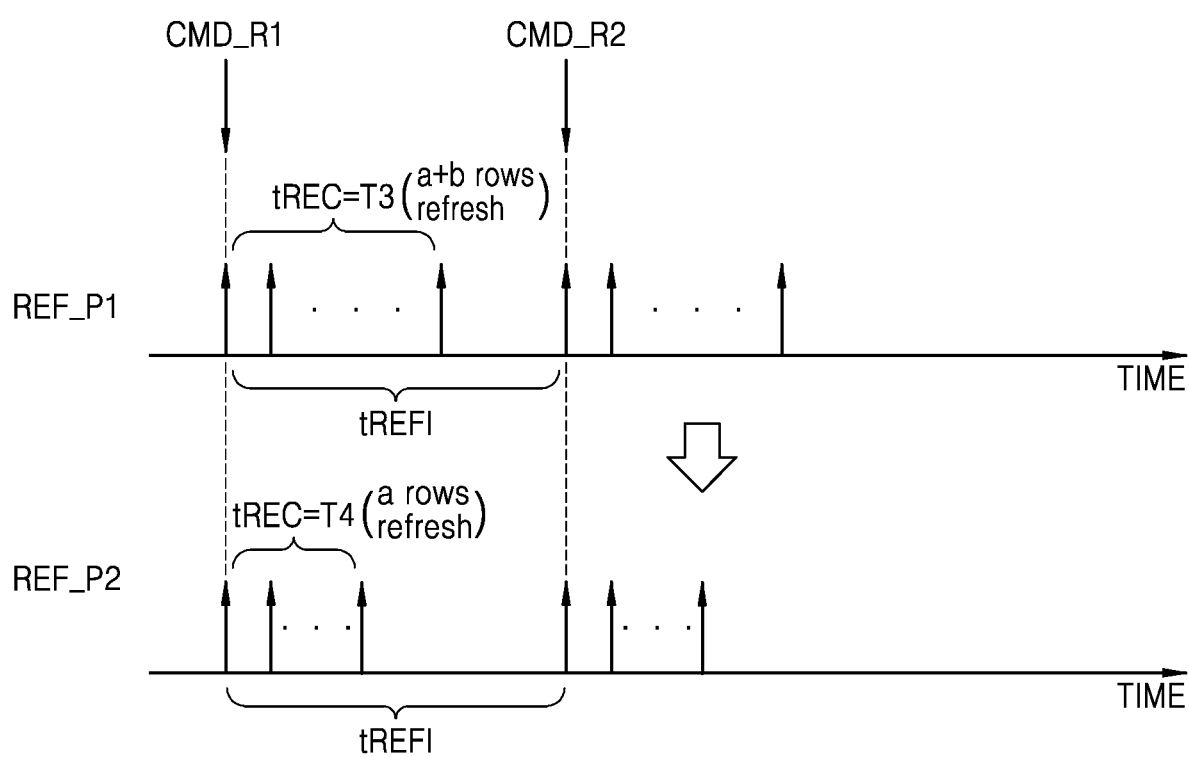

FIGS. 9A and 9B are diagrams illustrating an example of a refresh operation according to the example embodiments shown in FIGS. 7 and 8. An example of a refresh operation when the value of the first parameter tREFI is changed is shown in FIG. 9A, and an example of a refresh operation when the value of the second parameter tRFC is changed is shown in FIG. 9B.

Referring to FIG. 9A, the memory controller may receive skip information from the memory device through at least one terminal, and may change the refresh interval by changing the value of the first parameter tREFI based on the received skip information. For example, in a first refresh period REF_P1, the value of the first parameter tREFI may have a first value T1, which is relatively small, and the memory controller may output a plurality of refresh commands (that is, first to third refresh commands CMD_R1 to CMD_R3) at each time interval of the first value T1.

As the frequency at which a refresh operation is skipped is increased, the memory controller may increase the value of the first parameter tREFI to a second value T2, which is relatively large, in a following second refresh period REF_P2, and accordingly, the memory controller may sequentially output the plurality of refresh commands (that is, the first to third refresh commands CMD_R1 to CMD_R3) at each time interval of the second value T2 in the second refresh period REF_P2.

Referring to FIG. 9B, the memory controller may change the time for performing the refresh operation by changing the value of the second parameter tRFC based on the skip information received from the memory device. For example, as the frequency at which a refresh operation is skipped is increased, the memory controller may change the value of the second parameter tRFC from a third value T3, which is relatively large, to a fourth value T4, which is relatively small. In addition, in the example embodiment of FIG. 9B, it is assumed that the time interval at which a refresh command is received does not change as the value of the first parameter tREFI remains the same.

In the first refresh period REF_P1, because the value of the second parameter tRFC is set to the third value T3 and the third value T3 is relatively large, a relatively large number (e.g., a+b) of rows may be refreshed in response to one refresh command (e.g., the first refresh command CMD_R1). On the contrary, in the following second refresh period REF_P2, the value of the second parameter tRFC may be set to the fourth value T4, which is relatively small, and a relatively small number of rows (e.g., a) may be refreshed in response to the first refresh command CMD_R1. That is, the memory controller may provide a command for accessing the memory device after a relatively short period of time after outputting the refresh command, and accordingly, the use efficiency of the memory device may be increased.

Figure 10A:
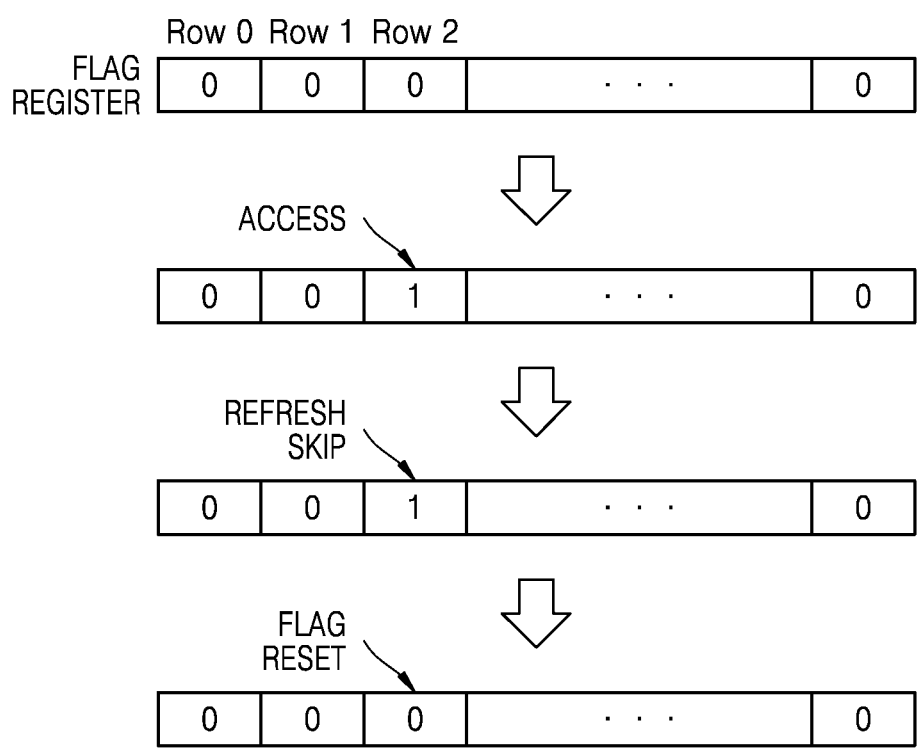
FIGS. 10A and 10B are diagrams illustrating updating a value of flag information according to an example embodiment.
Figure 10B:
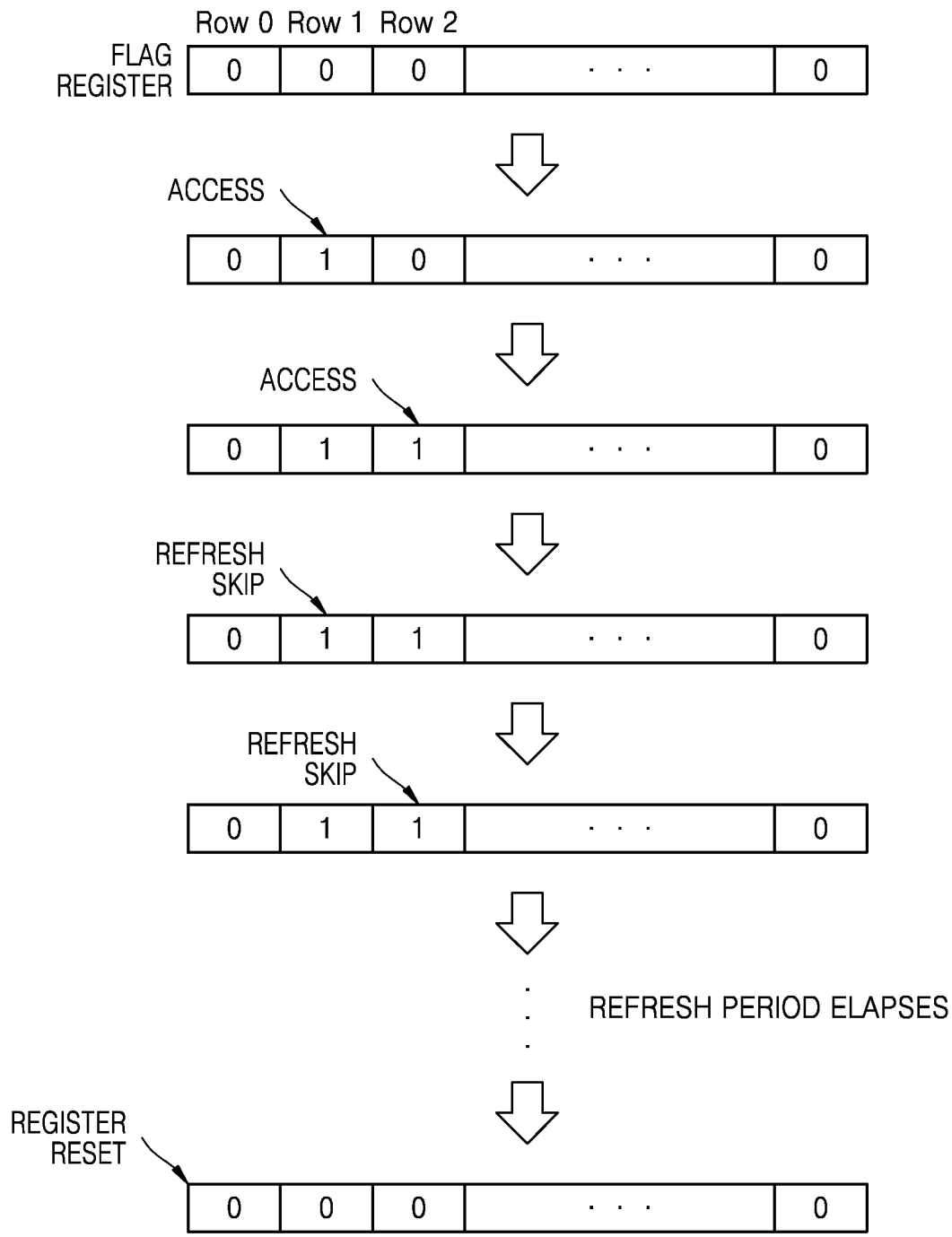

FIGS. 10A and 10B are diagrams illustrating an example of updating a value of flag information according to an example embodiment.

Referring to FIG. 10A, an access information storage circuit may include registers (e.g., flag registers), and flag information corresponding to a plurality of rows may be stored in the registers. For example, flag information corresponding to first to third rows Row0 to Row2 is shown.

The plurality of rows may be sequentially refreshed in one refresh period and the third row Row2 may be accessed before the third row R2 is refreshed. As access to the third row Row2 is performed, a value of the flag information corresponding to the third row Row 2 may be set to "1". Thereafter, the value of the flag information may be checked at a refresh timing for the third row Row2, and a refresh operation for the third row Row2 may be skipped as the value of the flag information corresponds to "1". In addition, the value of the flag information corresponding to the third row Row2 in which the refresh operation is skipped may be reset to "0", and in a next refresh period, the refresh operation for the third row Row2 may be performed. For example, the flag information for each of the plurality of rows may be reset at the beginning of each refresh period or at the end of each refresh period.

An example in which registers are reset in units of refresh periods is shown in FIG. 10B.

The registers may have a reset state, and the second row R1 and the third row R2 may be accessed before being refreshed. As accesses to the second row Row1 and the third row Row2 are performed, values of the flag information corresponding to the second row Row1 and the third row Row2 may be set to "1". Thereafter, the values of the flag information may be checked at refresh timings for the second row Row1 and the third row Row2, respectively, and refresh operations for the second row Row1 and the third row Row2 may be skipped.

At a refresh timing for each row, a value of the flag information may be maintained without being reset, and the registers may be all reset as one refresh period elapses. Accordingly, in a next refresh period, values of the flag information may be changed again according to accesses to rows, and a refresh operation for a target row may be performed or skipped according to the changed flag information.

In the example embodiments shown in FIGS. 10A and 10B, when access to a row that has already been refreshed in one refresh period is performed, an operation of setting flag information in a register may be performed by various methods. For example, by determining an address in which access is requested, when a row corresponding to the address corresponds to a row that has been previously refreshed or skipped, the corresponding flag information may not be changed. Accordingly, a case in which a refresh operation for a row is unintentionally skipped in a next refresh period may be prevented, and accordingly, loss of data of the row may be prevented.

Alternatively, according to an example embodiment, as shown in FIG. 10B, even when a row to be accessed corresponds to a row that has been previously refreshed or skipped, the flag information corresponding to the row may be set to a value of "1". For example, in the example embodiment of FIG. 10B, the plurality of registers may be all reset as one refresh period elapses, and accordingly, a case in which a refresh operation for the row is unintentionally skipped in a next refresh period may be prevented.

Figure 11:
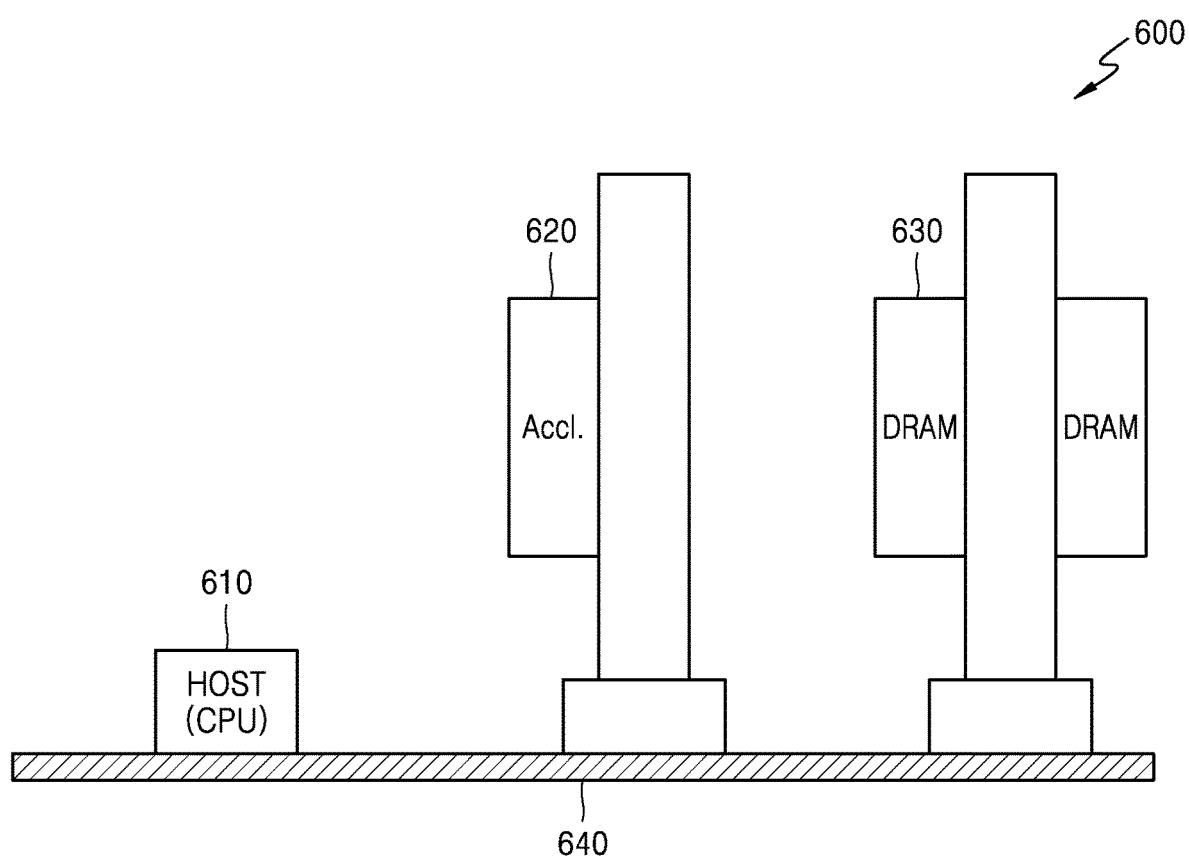
FIGS. 11 and 12 are block diagrams illustrating a computing system in which a host and an accelerator share a memory device according to an example embodiment.
Figure 12:
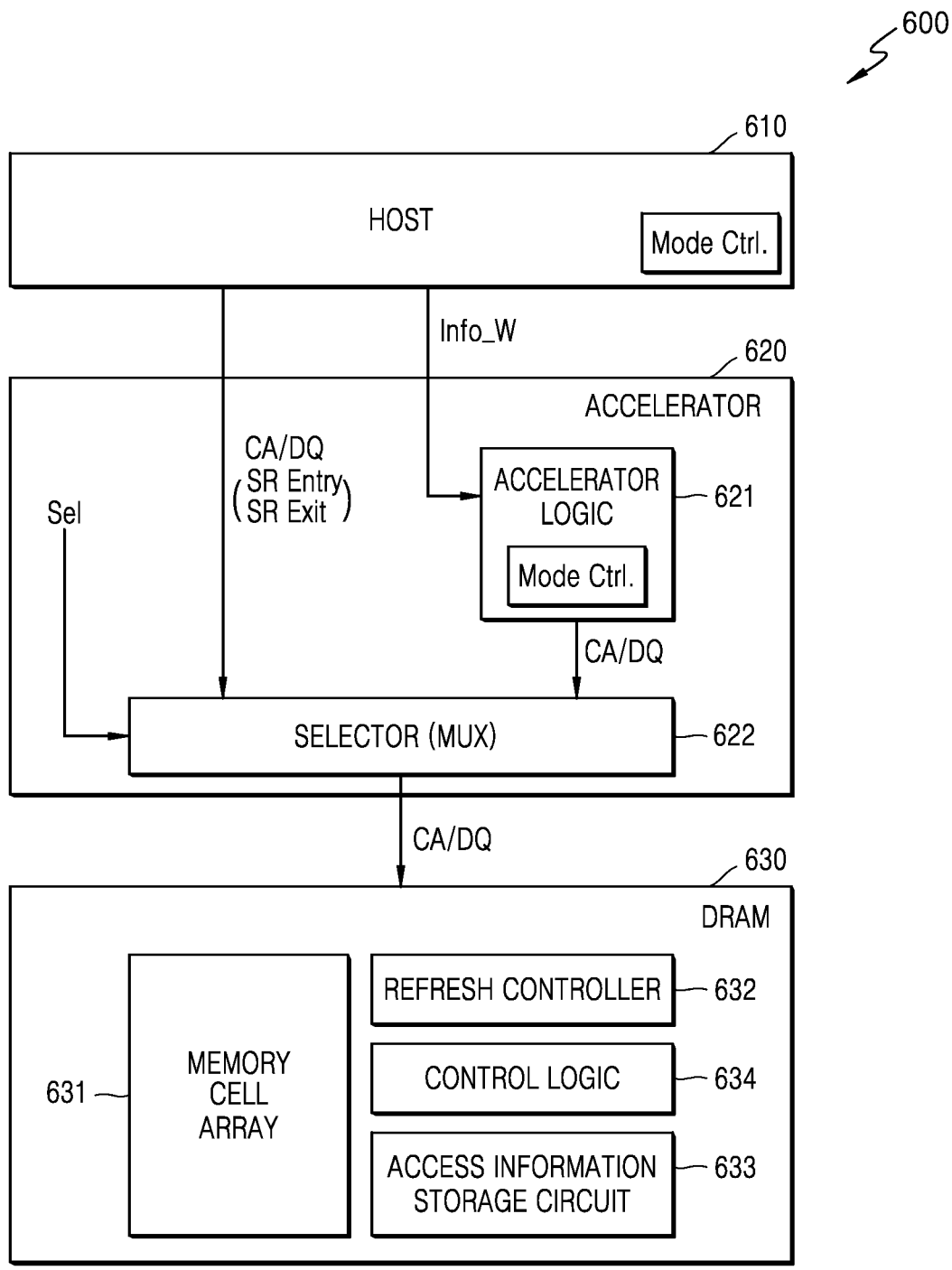

FIGS. 11 and 12 are block diagrams illustrating an example embodiment of a computing system 600 in which a host 610 and an accelerator 620 share a memory device.

Referring to FIGS. 11 and 12, the computing system 600 may correspond to the memory system or include the memory system in the above-described example embodiments, and the computing system 600 may include the host 610, the accelerator 620, and one or more memory devices (e.g., DRAM 630). The host 610 may correspond to a CPU or include the CPU, and may be referred to as a host device in terms of operating as a host for the accelerator 620 and the DRAM 630. Each of the host 610 and the accelerator 620 may include a memory controller controlling the DRAM 630, and the memory controller may correspond to the memory controller described in the above example embodiments.

The accelerator 620 may include at least one of programmable components such as a graphics processing unit (GPU) and a neural processing unit (NPU), components providing fixed functions such as an intellectual property (IP) core, and reconfigurable components such as a field programmable gate array (FPGA). At least a portion of computing and/or input/output (I/O) operations executed by the host 610 may be offloaded to the accelerator 620.

In the example embodiment shown in FIG. 11, a structure in which various components included in the computing system 600 are mounted on a printed circuit board (PCB) 640 is illustrated, and the PCB 640 may include slots for mounting the various components, and for example, may include a CPU slot in which the host 610 is mounted, and memory slots in which a memory module is mounted. The DRAM 630 may include memory modules such as a single in memory module (SIMM) and a dual in memory module (DIMM), and in FIG. 11, an example is illustrated in which a DIMM is mounted on a DIMM slot.

According to an example embodiment, the accelerator 620 may be mounted on a DIMM slot, and perform communication between the host 610 and the DRAM 630. For example, the accelerator 620 may be mounted on one surface of a module board. The accelerator 620 may receive a command/address signal CA and data DQ from the host 610, and provide the command/address signal CA and data DQ generated by the host 610 to the DRAM 630.

Referring to FIG. 12, the host 610, the accelerator 620, and the DRAM 630 may have a hierarchical structure, and the accelerator 620 may access a particular section the DRAM 630 which the host 610 does not access. The accelerator 620 may include an accelerator logic 621 and a selector 622, wherein the accelerator 620 may generate the command/address signal CA and data DQ for accessing the DRAM 630, and the selector 622 may output the command/address signal CA and data DQ from the host 610 or the accelerator logic 621 in response to a selection signal Sel. In addition, the DRAM 630 may include a memory cell array 631, a refresh controller 632, an access information storage circuit 633, and a control logic 634, as described in the above example embodiments.

For example, the host 610 may control the DRAM 630 to enter various operation modes such as a normal operation mode, a self-refresh mode, and a power down mode, and the accelerator 620 may occupy and use the DRAM 630 in a particular mode (e.g., the self-refresh mode or the like). According to an example embodiment, the accelerator 620 may determine the above-described various modes by monitoring a signal provided from the host 610, and for example, may determine entry of the self-refresh mode SR Entry and exit of the self-refresh mode SR Exit based on a command/address signal CA generated by the host 610. In addition, the accelerator 620 may start occupying the DRAM 630 by determining the entry of the self-refresh mode SR Entry and release the occupancy of the DRAM 630 by determining the exit of the self-refresh mode SR Exit.

According to an example embodiment, each of the host 610 and the accelerator 620 may independently set a mode for the DRAM 630. For example, each of the host 610 and the accelerator 620 may include a mode controller, and may control modes, which indicate whether to skip or perform the refresh operation in the DRAM 630, or the like, through the mode controller. For example, according to the above-described example embodiments, in controlling a refresh operation based on a value of flag information, the host 610 may apply any one of an operation of performing a refresh operation for a target row, an operation of skipping a refresh operation for the target row, and an operation of performing a refresh operation for other rows, and the accelerator 620 may apply another operation. For example, the host 610 may control the DRAM 630 so that the target row is refreshed at a refresh timing regardless of row access, and on the contrary, the accelerator 620 may control the DRAM 630 so that the refresh operation for the target row is skipped according to a value of flag information corresponding to the target row.

According to an example embodiment, the accelerator 620 may set a mode based on the amount and type of computing and/or input/output (I/O) tasks assigned from the host 610. For example, the accelerator 620 may determine an amount of tasks to be performed during the self-refresh mode of the DRAM 630 and set the above mode based on the determination. Alternatively, the accelerator 620 may receive separate workload information Info_W indicating the amount of tasks through communication with the host 610 and set the above mode based on the received workload information Info_W. For example, when the amount of tasks (or workload) is relatively large, the accelerator 620 may need to ensure a lot of access time to the DRAM 630, and accordingly, the accelerator 620 may set the mode so that the refresh operation for the target mode is skipped based on the value of flag information corresponding to the target row. On the contrary, when the amount of tasks (or workload) is relatively small, the accelerator 620 may control the target row to be refreshed regardless of the value of the flag information at the refresh timing, or may control the DRAM 630 so that rows other than the target row are refreshed at the refresh timing.

Communication between the host 6101 and the accelerator 620 may be performed based on various protocols, and as an example, a peripheral component interconnect express (PCIe) protocol may be applied. However, example embodiments are not limited thereto, and the host 610 and the accelerator 620 may communicate with each other by using various protocols such as a compute express link (CXL) protocol, an XBUS protocol, an NVLINK protocol, an infinity Fabric protocol, a cache coherent interconnect for accelerators (CCIX) protocol, and a coherent accelerator processor interface (CAPI) protocol.

FIGS. 13A, 13B, 14 and 15 are diagrams illustrating an example of a refresh operation in a memory system according to another example embodiment. FIGS. 13A, 13B, 14 and 15 illustrate a case in which the refresh operation is performed in an x1 mode, an x2 mode, and an x4 mode in one refresh period tREF.

Figure 13A:
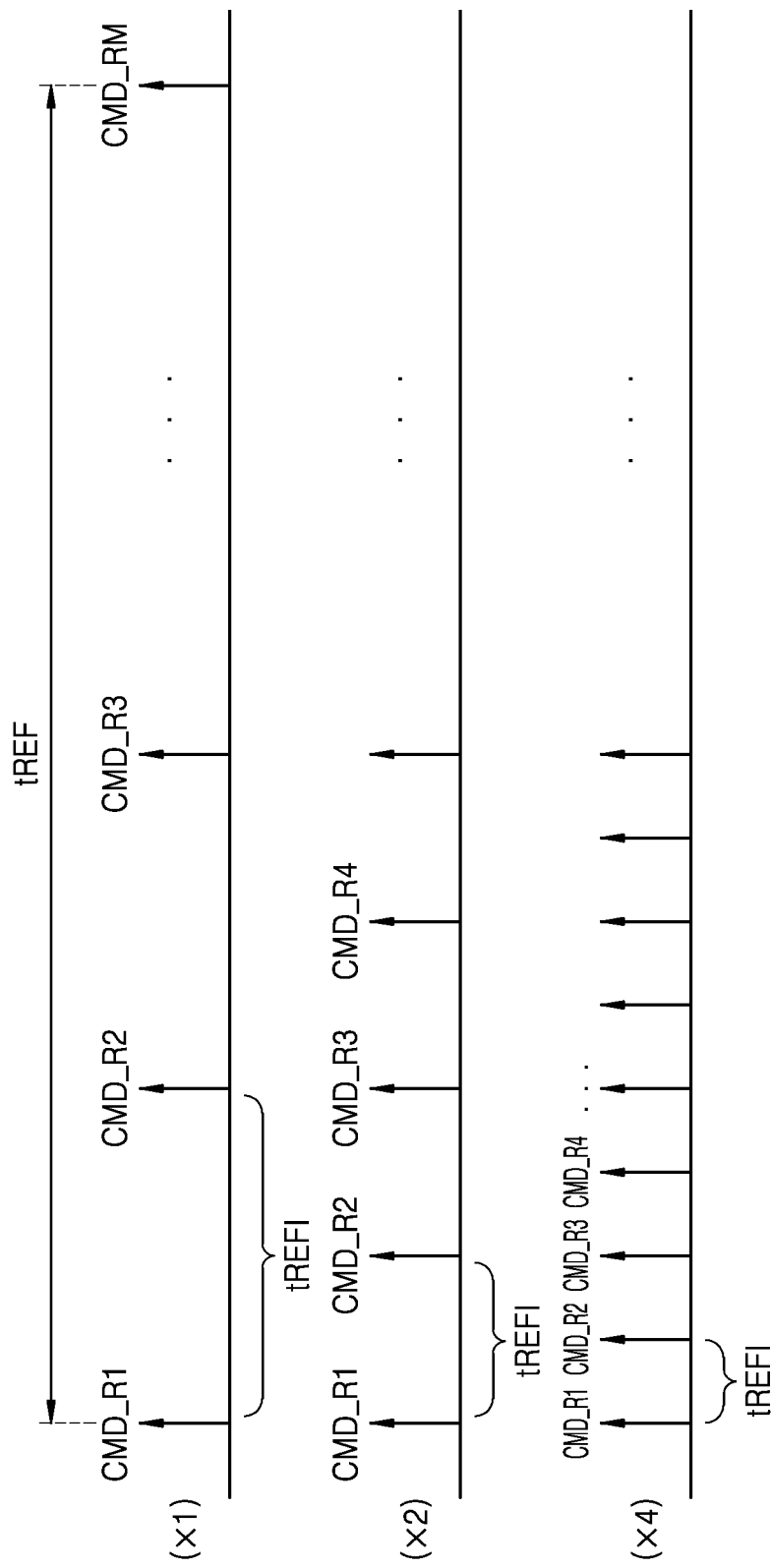
FIGS. 13A, 13B, 14 and 15 are diagrams illustrating a refresh operation in a memory system according to another example embodiment.

Referring to FIG. 13A, one refresh period tREF (e.g., 64 ms) may be defined between a memory controller and a memory device, and a refresh operation may be performed according to the x1 mode, the x2 mode, and the x4 mode based on a setting of the memory controller. A refresh command may be provided to the memory device such that each row is refreshed once in one refresh period tREF in the x1 mode, each row is refreshed twice in one refresh period tREF in the x2 mode, and each row is refreshed four times in one refresh period tREF in the x4 mode. Accordingly, as shown in FIG. 13A, a first parameter tREFI indicating a refresh interval in the x2 mode may be shorter than that of the x1 mode by ½, and the first parameter tREFI indicating a refresh interval in the x4 mode may be shorter than that of the x1 mode by ¼.

Figures 13B, 14:
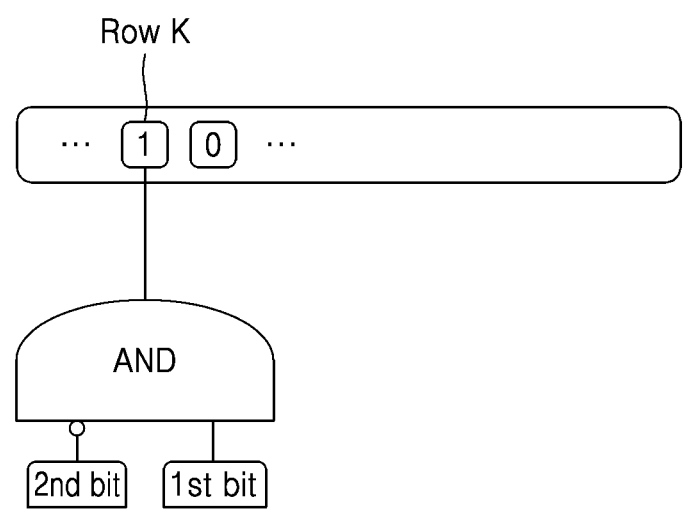

Referring to FIG. 13B, the number of times of skipping refresh operations for each row may be differently set according to the x1 mode, the x2 mode, and the x4 mode. For example, as a refresh operation for a particular row (e.g., row A) is skipped, when an actual refresh operation for the row A is performed after a time required by the specification has elapsed, the possibility of data loss may increase.

According to an example embodiment, the number of times of skipping refresh operations for each row may be differently set according to the x1 mode, the x2 mode, and the x4 mode. For example, in the x1 mode, whether to skip a refresh operation based on a value of flag information according to example embodiments may be selectively applied. For example, skipping of a refresh operation according to example embodiments may not be applied in the x1 mode, or the memory device may operate such that at most one refresh operation for each row may be skipped in one refresh period tREF.

On the contrary, skipping of a refresh operation according to example embodiments may be applied in the x2 mode, or the memory device may operate such that at most one refresh operation for each row may be skipped in one refresh period tREF. In this case, each row may be refreshed at least once in one refresh period tREF (64 ms).

In addition, skipping of a refresh operation according to example embodiments may be applied in the x4 mode, or the memory device may operate such that at most three refresh operations for each row may be skipped in one refresh period tREF. In this case, each row may be refreshed at least once in one refresh period tREF (64 ms).

The maximum number of times of refresh operations skipped according to the above example embodiment may be controlled in various ways, and as an example, the control may be performed by managing an operation of updating flag information in registers. For example, the number of updates (or the number of times set to a value of "1") may be counted, and as an example, when three updates are performed on a register corresponding to a particular row in the x4 mode, the maximum number of times of refresh operations skipped for each row may be adjusted to be less than a particular value by controlling not to perform additional updates to the register in one refresh period.

In the above-described example embodiment, the x1 mode, the x2 mode, and the x4 mode have been described in relation to the refresh mode, but example embodiments are not limited thereto, and may be applied to x3, x5, and various other modes.

Figures 15, 16:
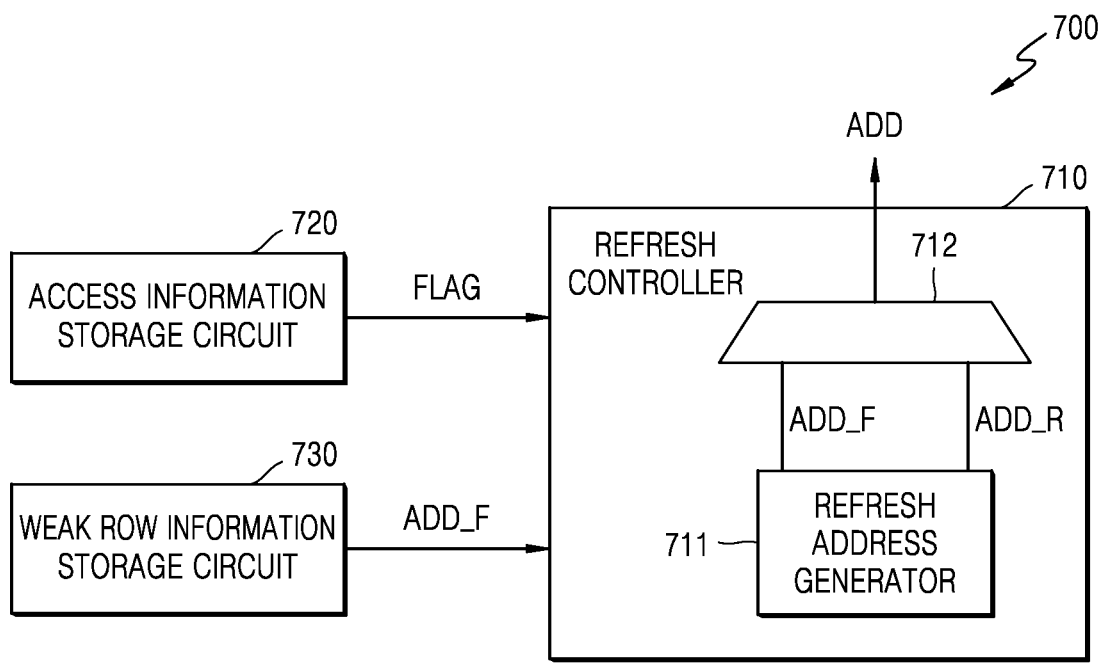
FIG. 16 is a block diagram illustrating a memory device according to another example embodiment.

FIGS. 14 and 15 illustrate a case in which a refresh operation for each row is designed to be skipped at most once in the x2 mode. As shown in FIG. 14, a memory device may include an access information storage circuit including a plurality of registers, and a logic device (e.g., an AND gate) providing flag information to each of the plurality of registers. In addition, in an example embodiment, the control logic may provide one or more bits for setting the flag information Flag based on an address from a host, and as an example, the control logic may provide a first bit 1st bit and an inverse of a second bit 2nd bit as inputs of the AND gate. The AND gate may output an AND computing result of the first bit 1st bit and the inverse of the second bit 2nd bit as the flag information Flag, thereby setting the flag information Flag corresponding to a row K Row K among a plurality of rows.

Referring to FIG. 15, the control logic may increase values of the first bit 1st bit and the second bit 2nd bit by 1 in various operations for the row K Row K to update the values provided to the AND gate. As an example, the flag information Flag may be set to an initial value of "0", and as access to the row K Row K is performed, bits having a value of "01" cause bits "11" to be input to the AND gate, and the flag information Flag may be set to a value of "1" according to an output of the AND gate.

Thereafter, at a refresh timing for the row K Row K, a refresh operation for the row K Row K may be skipped according to the value of the flag information Flag, and as bits having a value of "10" cause bits "00" to be input to the AND gate, the flag information Flag may be reset to a value of "0". Then, as access to the row K Row K is performed again, even when bits having a value of "11" cause bits "01" to be input to the AND gate, the output of the AND gate has a value of "0", and accordingly, the flag information Flag may be maintained as the value of "0". Accordingly, the refresh operation for the row K Row K may not be skipped at a next refresh timing for the row K Row K.

According to example embodiment described above, in the x2 mode in which each row is refreshed twice in one period, the refresh operation may be skipped once even when each row is accessed twice. According to various example embodiments, by adjusting the number of bits and the bit values input to a logic device in other xM modes (M is an integer of 3 or more), refresh operations for each row may be skipped in various methods in the xM mode.

In the above-described example embodiments, an example in which a refresh skip operation according to example embodiments is applied to a normal refresh operation based on a refresh command from a memory controller is described. However, example embodiments are not limited thereto. For example, a memory device may perform various operations by itself in a self-refresh mode (e.g., processor in memory (PIM) computing, or the like) and one or more rows may be refreshed through the various operations. Accordingly, example embodiments may be also applied to a refresh operation in the self-refresh mode of the memory device.

FIG. 16 is a block diagram illustrating a memory device 700 according to another example embodiment. In FIG. 16, only some of components related to a refresh operation are illustrated to be included in the memory device 700.

Referring to FIG. 16, the memory device 700 may include a refresh controller 710, an access information storage circuit 720, and a weak row information storage circuit 730. Some of a plurality of rows in a memory cell array of the memory device 700 may correspond to weak rows having relatively poor data retention characteristics, and information related to the weak row may be tested in a manufacturing operation of the memory device 700 and stored in the memory device 700, or may be generated through an initial test operation when a memory system including the memory device 700 is initially driven and also stored in the memory device 700.

The refresh controller 710 may include a refresh address generator 711 generating a refresh address ADD_R, and may receive an address ADD_F of a weak row provided from the weak row information storage circuit 730. In addition, according to the above described example embodiment, the refresh controller 710 may perform or skip a refresh operation for a target row based on flag information Flag from the access information storage circuit 720.

The refresh controller 710 include a selector 712 to receive the refresh address ADD_R and the address ADD_F of the weak row and selectively output any one address ADD. Through a mode setting for the memory device 700, the memory device 700 may be controlled to perform or skip a refresh operation for a target row, or may be controlled to refresh rows other than the target row. An operation of the selector 712 may be controlled through the mode setting for the memory device 700, when a refresh operation for a target row is performed, the refresh address ADD_R may be selectively output, and when other rows (e.g., weak rows) are refreshed, the address ADD_F of the weak row may be selectively output. Alternatively, when a refresh operation is skipped, the output of the address ADD from the selector 712 may be blocked.

Figure 17:
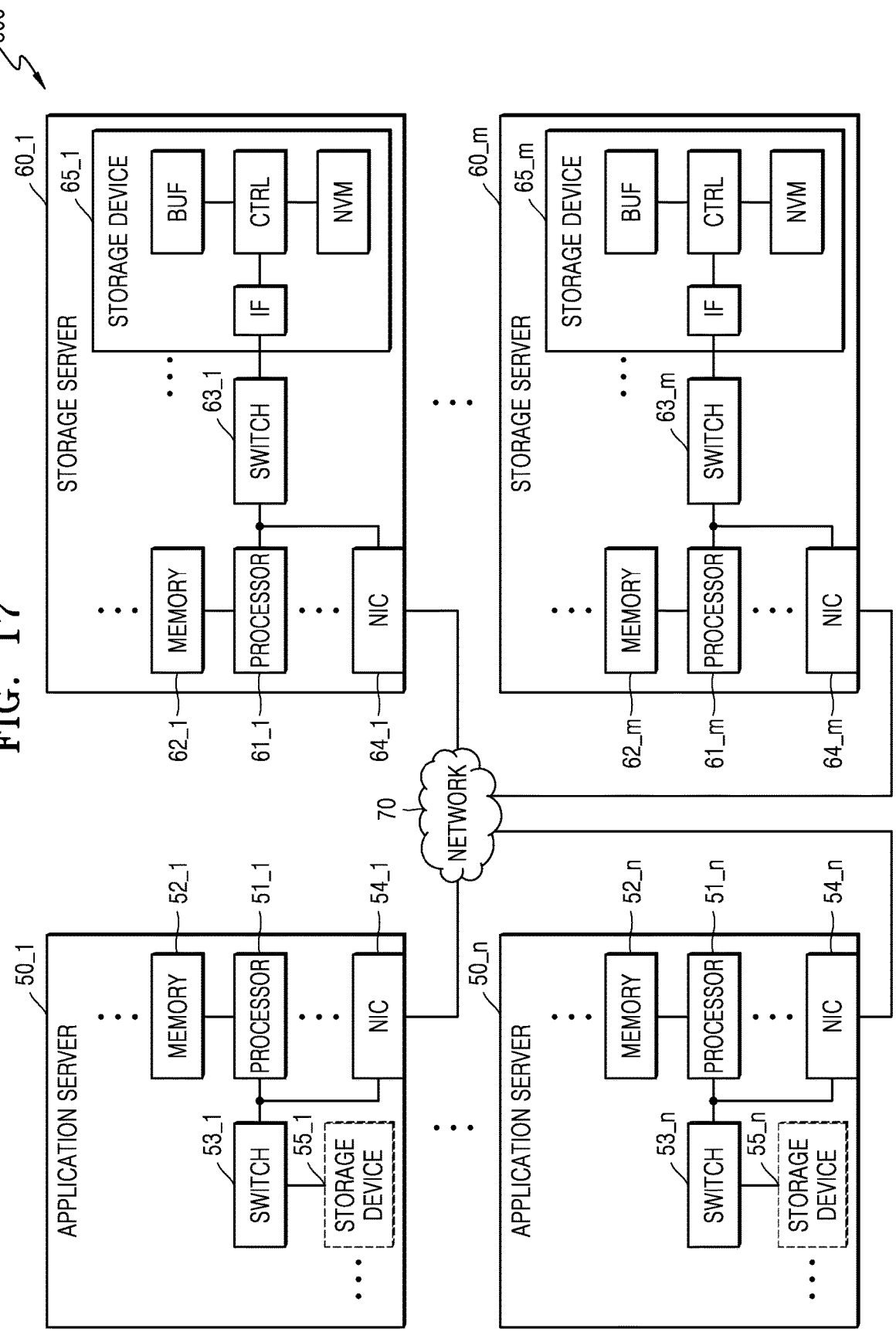
FIG. 17 is a block diagram illustrating a data center including a system according to an example embodiment.

FIG. 17 is a block diagram illustrating a data center 800 including a system according to an example embodiment. In some example embodiments, the memory system described above with reference to the drawings may be included in an application server and/or a storage server of the data center 800.

Referring to FIG. 17, the data center 800 may collect various pieces of data and provide services, and may be referred to as a data storage center. For example, the data center 800 may be a system for operating a search engine and a database, or may be a computing system used by a company such as a bank or a government institution. As shown in FIG. 17, the data center 800 may include application servers 50_1 to 50_n and storage servers 60_1 to 60_m (m and n are integers greater than 1). The number n of application servers 50_1 to 50_n and the number m of storage servers 60_1 to 60_m may be variously selected according to example embodiments, and the number n of application servers 50_1 to 50_n and the number m of storage servers 60_1 to 60_m may be different from each other.

The application servers 50_1 to 50_n may include at least one of processors 51_1 to 51_n, memories 52_1 to 52_n, switches 53_1 to 53_n, network interface controllers (NIC) 54_1 to 54_n, and storage devices 55_1 to 55_n. The processors 51_1 to 51_n may control all operations of the application servers 50_1 to 50_n, and may access the memories 52_1 to 52_n to access instructions and/or data loaded into the memories 52_1 to 52_n. Non-limiting examples of the memories 52_1 to 52_n may include double data rate synchronous DRAM (SDRAM), high bandwidth memory (HBM), a hybrid memory cube (HMC), a dual in-line memory module (DIMM), an Optane DIMM, or a non-volatile DIMM (NVMDIMM).

According to an example embodiment, the number of processors and the number of memories included in the application servers 50_1 to 50_n may be variously selected. In some example embodiments, the processors 51_1 to 51_n and the memories 52_1 to 52_n may provide a processor-memory pair. In some example embodiments, the number of processors 51_1 to 51_n and the number of memories 52_1 to 52_n may be different from each other. The processors 51_1 to 51_n may include a single-core processor or a multi-core processor. In some example embodiments, as illustrated by a dashed line in FIG. 17, in the application servers 50_1 to 50_n, the storage devices 55_1 to 55_n may be omitted. The number of storage devices 55_1 to 55_n included in the application servers 50_1 to 50_n may be variously selected according to example embodiments. The processors 51_1 to 51_n, the memories 52_1 to 52_n, the switches 53_1 to 53_n, the NIC 54_1 to 54_n, and/or the storage devices 55_1 to 55_n may communicate with each other through the like described above with reference to the drawings.

The storage servers 60_1 to 60_m may include at least one of processors 61_1 to 61_m, memories 62_1 to 62_m, switches 63_1 to 63_m, NICs 64_1 to 64_m, and storage devices 65_1 to 65_m. The processors 61_1 to 61_m and the memories 62_1 to 62_m may operate similarly to the processors 51_1 to 51_n and the memories 52_1 to 52_n of the application servers 50_1 to 50_n described above.

The memories 52_1 to 52_n and 62_1 to 62_m included in the application servers 50_1 to 50_n and the storage servers 60_1 to 60_m may include the memory devices according to the above-described example embodiments. For example, the memories 52_1 to 52_n and 62_1 to 62_m may include volatile memory devices such as DRAM, and flag information setting and skipping of refresh operations according to the above example embodiments may be applied in performing a refresh operation on a plurality of rows.

The application servers 50_1 to 50_n and the storage servers 60_1 to 60_m may communicate with each other through a network 70. In some example embodiments, the network 70 may be implemented by using a fiber channel (FC) or Ethernet. The FC may be a medium used for relatively high-speed data transmission, and an optical switch providing high performance/high availability may be used. According to an access method of the network 70, the storage servers 60_1 to 60_m may be provided as file storage, block storage, or object storage.

In some example embodiments, the network 70 may be a storage dedicated network such as a storage area network (SAN). For example, the SAN may use an FC network, and may be an FC-SAN implemented according to an FC protocol (FCP). Alternatively, the SAN may be an IP-SAN using a transmission control protocol/internet protocol (TCP/IP) network and implemented according to an SCSI over TCP/IP or internet SCSI (iSCSI) protocol. In some example embodiments, the network 70 may be a generic network such as the TCP/IP network. For example, the network 70 may be implemented according to protocols such as FC over Ethernet (FCoE), network attached storage (NAS), NVMe over fabrics (NVMe-oF), or the like.

Hereinafter, although the application server 50_1 and the storage server 60_1 are mainly described, the description of the application server 50_1 may be applied to other application servers (e.g., 50_n), and the description of the storage server 60_1 may be applied to other storage servers (e.g., 60_m).

The application server 50_1 may store data requested to be stored by a user or a client in one of the storage servers 60_1 to 60_m through the network 70. In addition, the application server 50_1 may obtain data requested to be read by user and the client from one of the storage servers 60_1 to 60_m through the network 70. For example, the application server 50_1 may be implemented as a web server or a database management system (DBMS).

The application server 50_1 may access the memory 52_n and/or the storage device 55_n included in another application server 50_n through the network 70, and/or access memories 62_1 to 62_m and/or storage devices 65_1 to 65_m included in the storage servers 60_1 to 60_m through the network 70. Accordingly, the application server 50_1 may perform various operations on data stored in the application servers 50_1 to 50_n and/or the storage servers 60_1 to 60_m. For example, the application server 50_1 may execute an instruction for moving or copying data between the application servers 50_1 to 50_n and/or the storage servers 60_1 to 60_m. At this time, data may be moved directly from the storage devices 65_1 to 65_m of the storage servers 60_1 to 60_m to the memories 52_1 to 52_n of the application servers 50_1 to 50_n, or may be moved from the storage devices 65_1 to 65_m of the storage servers 60_1 to 60_m to the memories 52_1 to 52_n of the application servers 50_1 to 50_n through the memories 62_1 to 62_m of the storage servers 60_1 to 60_m. In some example embodiments, the data moving through the network 70 may be encrypted data for security or privacy.

In the storage server 60_1, an interface IF may provide a physical connection between the processor 61_1 and a controller CTRL and a physical connection between the NIC 64_1 and the controller CTRL. For example, the interface IF may be implemented in a direct attached storage (DAS) method in which the storage device 65_1 is directly connected to through a dedicated cable. In addition, for example, the interface IF may be implemented in various interface methods such as advanced technology attachment (ATA), serial ATA (SATA), external SATA (e-SATA), small computer small interface (SCSI), serial attached SCSI (SAS), peripheral component interconnection (PCI), PCI express (PCIe), non-volatile memory (NVM) express (NVMe), IEEE 1394, universal serial bus (USB), a secure digital (SD) card, a multi-media card (MMC), an embedded multi-media card (eMMC), a universal flash storage (UFS), an embedded universal flash storage (eUFS), a compact flash (CF) card interface.

In the storage server 60_1, a switch 63_1 may selectively connect the processor 61_1 to the storage device 65_1 or selectively connect the NIC 64_1 to the storage device 65_1, according to the control of the processor 61_1.

In some example embodiments, the NIC 64_1 may include a network interface card, a network adapter, or the like. The NIC 64_1 may be connected to the network 70 through a wired interface, a wireless interface, a Bluetooth interface, an optical interface, or the like. The NIC 64_1 may include an internal memory, a digital signal processor (DSP), a host bus interface, or the like, and may be connected to the processor 61_1 and/or the switch 63_1 through the host bus interface. In some example embodiments, the NIC 64_1 may be integrated with at least one of the processor 61_1, the switch 63_1, and the storage device 65_1.

In the application servers 50_1 to 50_n or the storage servers 60_1 to 60_m, the processors 51_1 to 51_n and 61_1 to 61_m may transmit commands to the storage devices 55_1 to 55_n and 65_1 to 65_m or memories 52_1 to 52_n and 62_1 to 62_m to program or read data. In this case, the data may be data that has been error-corrected through an error correction code (ECC) engine. The data may be data in which data bus inversion (DBI) or data masking (DM) is treated, and may include cyclic redundancy code (CRC) information. The data may be encrypted data for security or privacy.

The storage devices 55_1 to 55_n and 65_1 to 65_m may transmit a control signal and a command/address signal to a non-volatile memory device NVM (e.g., a NAND flash memory device) in response to a read command received from the processors 51_1 to 51_n and 61_1 to 61_m. Accordingly, when data is read from the non-volatile memory device NVM, a read enable signal is input as a data output control signal and may serve to output data to the DQ bus. A data strobe signal may be generated by using the read enable signal. A command and address signal may be latched according to a rising edge or a falling edge of a write enable signal.

The controller CTRL may control all operations of the storage device 65_1. In an example embodiment, the controller CTRL may include static random access memory (SRAM). The controller CTRL may write data to the non-volatile memory device NVM in response to a write command, or read data from the non-volatile memory device NVM in response to a read command. For example, the write command and/or the read command may be generated based on a request provided from a host, for example, the processor 61_1 in the storage server 60_1, the processor 61_m in the other storage server 60_m, or the processors 51_1 to 51_n of the application servers 50_1 to 50_n. A buffer BUF may temporarily store (buffer) data to be written to the non-volatile memory device NVM or data to be read from the non-volatile memory device NVM. In some example embodiments, the buffer BUF may include DRAM. In addition, the buffer BUF may store meta data, and the meta data may refer to user data or data generated by the controller CTRL to manage the non-volatile memory device NVM. The storage device 65_1 may include a secure element (SE) for security or privacy.

While example embodiments have been shown and described, it will be understood that various changes in form and details may be made therein without departing from the spirit and scope of the following claims.

What is claimed is:

1. A memory device comprising:
   a memory cell array comprising N rows, wherein N is an integer greater than or equal to 2;
   a refresh controller configured to control a refresh operation for the N rows of the memory cell array based on a refresh command; and
   an access information storage circuit comprising a plurality of registers configured to store flag information corresponding to each of the N rows, wherein a first value indicates rows that have been accessed, and a second value indicates rows that have not been accessed,
   wherein the refresh controller is further configured to, at a refresh timing for a first row of the N rows:
   obtain a refresh address indicating the first row,
   obtain the flag information corresponding to the first row from the access information storage circuit based on the refresh address,
   based on the refresh address indicating the first row and the flag information corresponding to the first row having the first value, control the refresh operation for the first row to be skipped, and
   based on the refresh address indicating the first row and the flag information corresponding to the first row having the second value, control the refresh operation for the first row to be performed.

2. The memory device of claim 1, further comprising a control logic configured to:
   control access to the memory cell array based on a command and an address received from a host; and
   identify a row to which access is performed based on the address received from the host, and set the flag information corresponding to the identified row as the first value.

3. The memory device of claim 2, wherein the control logic is further configured to control a mode setter to set an operation mode related to the refresh operation, and
   wherein the refresh controller is further configured to:

based on the operation mode being a refresh skip mode and the first row having been previously accessed in a first refresh period, control the refresh operation of the first row to be skipped at the refresh timing for the first row in the first refresh period, and based on the operation mode being a refresh performing mode, control the refresh operation of the first row to be performed at the refresh timing for the first row in the first refresh period regardless of whether the first row has been accessed in the first refresh period.

4. The memory device of claim 3, wherein the refresh controller is further configured to, based on the operation mode being a refresh performing mode of other rows and the first row having been previously accessed in the first refresh period, control the refresh operation to be performed on a second row of the N rows other than the first row at the refresh timing for the first row in the first refresh period.

5. The memory device of claim 4, further comprising a weak row information storage circuit configured to store information indicating one or more rows having relatively poor data retention characteristics among the N rows,
wherein the refresh controller is further configured to identify the second row based on the information stored in the weak row information storage circuit indicating the second row.

6. The memory device of claim 1, wherein the refresh controller is further configured to, after the refresh operation for the first row is skipped based on the flag information corresponding to the first row having the first value, reset the flag information corresponding to the first row to the second value at the refresh timing for the first row.

7. The memory device of claim 1, wherein the refresh controller is further configured to:
in a first refresh period, based on the flag information corresponding to at least two rows among the N rows having the first value, control the refresh operation of the at least two rows to be skipped in the first refresh period, and
reset the flag information of the plurality of registers of the access information storage circuit to the second value at an end of the first refresh period.

8. The memory device of claim 1, wherein the memory device is configured to transmit skip information indicating that the refresh operation for one or more rows among the N rows has been skipped to a host through at least one terminal.

9. The memory device of claim 8, wherein the memory device is further configured to receive any one or any combination of a first parameter and a second parameter related to the refresh operation from the host, and
wherein the refresh controller is further configured to control a reception interval of the refresh command based on the first parameter.

10. The memory device of claim 9, wherein the refresh controller is further configured to control a time to perform the refresh operation in response to one refresh command received from the host based on the second parameter.

11. The memory device of claim 1, wherein the memory device is further configured to operation in M refresh modes, wherein M is an integer greater than or equal to 2, and
wherein a maximum of M−1 refresh operations are skipped in each of the N rows in a first refresh period based on the memory device operating in an Mth refresh mode from among the M refresh modes.

12. An operating method of a memory device, the operating method comprising:

accessing a first row from among N rows provided in a memory cell array, wherein N is an integer greater than or equal to 2;
storing flag information having a first value in a first register corresponding to the first row in an access information storage circuit comprising a plurality of registers;
generating a refresh address indicating the first row;
obtaining the flag information corresponding to the first row from the access information storage circuit based on the refresh address;
identifying the flag information stored in the first register corresponding to the first row at a refresh timing for the first row based on a refresh command and the refresh address; and
skipping a refresh operation for the first row based on the refresh address indicating the first row and the flag information corresponding to the first row having the first value.

13. The operating method of claim 12, further comprising:
identifying the flag information stored in a second register corresponding to a second row in the access information storage circuit at a refresh timing for the second row based on the refresh command; and
performing the refresh operation on the second row based on the flag information corresponding to the second row having a second value.

14. The operating method of claim 12, further comprising after skipping the refresh operation for the first row, resetting the flag information stored in the first register to a second value.

15. The operating method of claim 12, further comprising performing the refresh operation on a second row different from the first row at the refresh timing for the first row according to an operation mode set in the memory device.

16. The operating method of claim 12, further comprising transmitting, by the memory device, skip information indicating that the refresh operation for one or more rows among the N rows has been skipped to a host through at least one terminal.

17. The operating method of claim 16, further comprising:
receiving the refresh command from the host every first time interval based on a first parameter indicating the first time interval in a first refresh period; and
receiving the refresh command from the host every second time interval different from the first time interval based on the first parameter indicating the second time interval in a second refresh period.

18. An operating method of a memory device, wherein the memory device includes a memory cell array having N rows and N is an integer greater than or equal to 2, the operating method comprising:
accessing a first row based on a first access request received from a first host device in a first refresh period;
refreshing the first row at a refresh timing for the first row based on a first refresh command received from the first host device;
accessing the first row based on a second access request from a second host device in a second refresh period;
storing flag information of a first value in a first register corresponding to the first row in an access information storage circuit comprising a plurality of registers; and
skipping a refresh operation for the first row at the refresh timing for the first row based on a second refresh command received from the second host device.

19. The operating method of claim 18, wherein the first host device includes a central processing unit, and the second host device comprises an accelerator.

20. The operating method of claim 18, further comprising after skipping the refresh operation for the first row in the second refresh period, resetting the flag information corresponding to the first row to a second value.

* * * * *